United States Patent
Shibao et al.

[19]

[11] Patent Number: 6,138,695
[45] Date of Patent: Oct. 31, 2000

[54] SUBSTRATE PROCESSING APPARATUS

[75] Inventors: Takuya Shibao; Toshiyuki Osaki; Koji Hasegawa, all of Shiga, Japan

[73] Assignee: Dainippon Screen Mfg. Co., Ltd., Japan

[21] Appl. No.: 09/180,032

[22] PCT Filed: Mar. 4, 1998

[86] PCT No.: PCT/JP98/00908

§ 371 Date: Oct. 30, 1998

§ 102(e) Date: Oct. 30, 1998

[30] Foreign Application Priority Data

| Mar. 7, 1997 | [JP] | Japan | 9-053055 |
| Jan. 27, 1998 | [JP] | Japan | 10-014320 |
| Jan. 30, 1998 | [JP] | Japan | 10-019154 |
| Jan. 30, 1998 | [JP] | Japan | 10-019155 |

[51] Int. Cl.⁷ ..................................................... B08B 3/02
[52] U.S. Cl. ........................... 134/61; 134/153; 134/147; 134/902
[58] Field of Search ..................... 211/41.18; 134/147, 134/153, 198, 61, 902, 201

[56] References Cited

U.S. PATENT DOCUMENTS

| 4,208,760 | 6/1980 | Dexter et al. | 134/902 |
| 4,985,722 | 1/1991 | Ushijima et al. | 134/902 |
| 5,314,509 | 5/1994 | Kato et al. | 134/902 |
| 5,626,159 | 5/1997 | Erk et al. | 134/147 |
| 5,950,643 | 9/1999 | Miyazaki et al. | 134/902 |

FOREIGN PATENT DOCUMENTS

| 2103949 | 4/1990 | Japan . | |
| 3-188631 | 8/1991 | Japan | 134/902 |
| 4-294535 | 10/1992 | Japan | 134/902 |
| 6163673 | 6/1994 | Japan . | |
| 9162265 | 6/1997 | Japan . | |

*Primary Examiner*—Frankie L. Stinson
*Attorney, Agent, or Firm*—Ostrolenk, Faber, Gerb & Soffen, LLP

[57] ABSTRACT

A substrate transport robot incorporated in a substrate processing apparatus includes a pair of retaining columns (35R, 35L) permitted to rotate on respective shafts (34) by a main body portion of the substrate transport robot. The side surface of each of the retaining columns (35R, 35L) is divided into five areas (AR1, AR2, AR3, AR4, AR5) in a circumferential direction about the axis of each retaining column (35R, 35L), and grooves (351A, 351B, 351C) for holding substrates are formed in the areas. Among these areas, an unprocessed substrate retaining area (AR4) holds substrates which have not yet been processed, an in-processing substrate retaining area (AR3) holds substrates with a cleaning liquid deposited thereon which are being processed, and a processed substrate retaining area (AR5) holds processed substrates which have already been subjected to cleaning processing and drying processing.

23 Claims, 33 Drawing Sheets

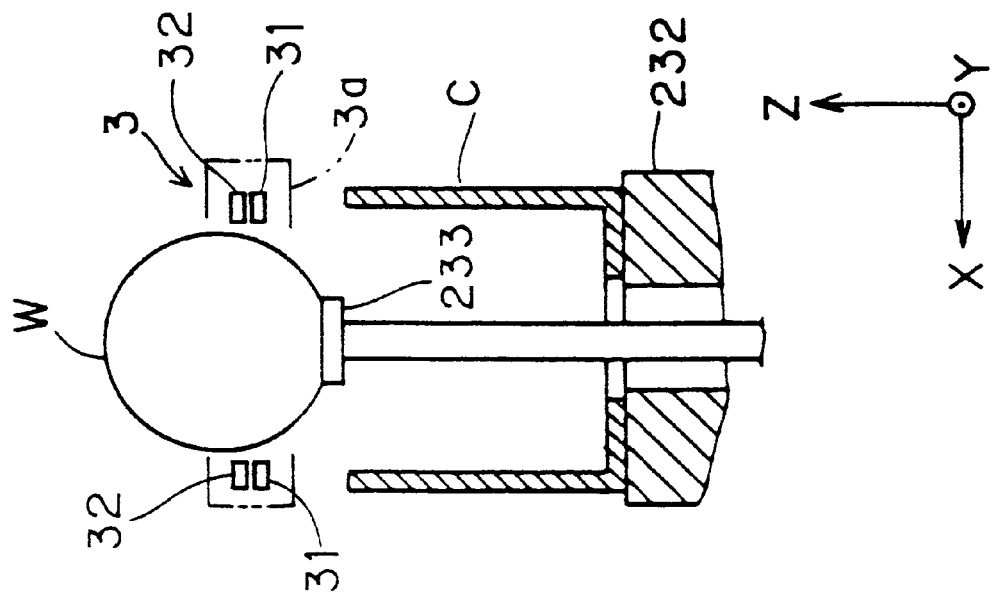
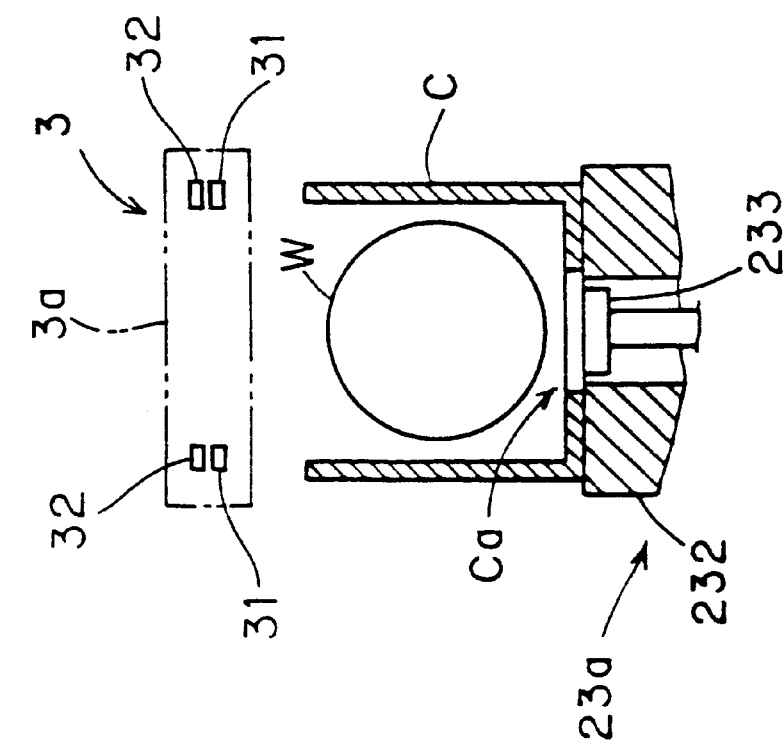

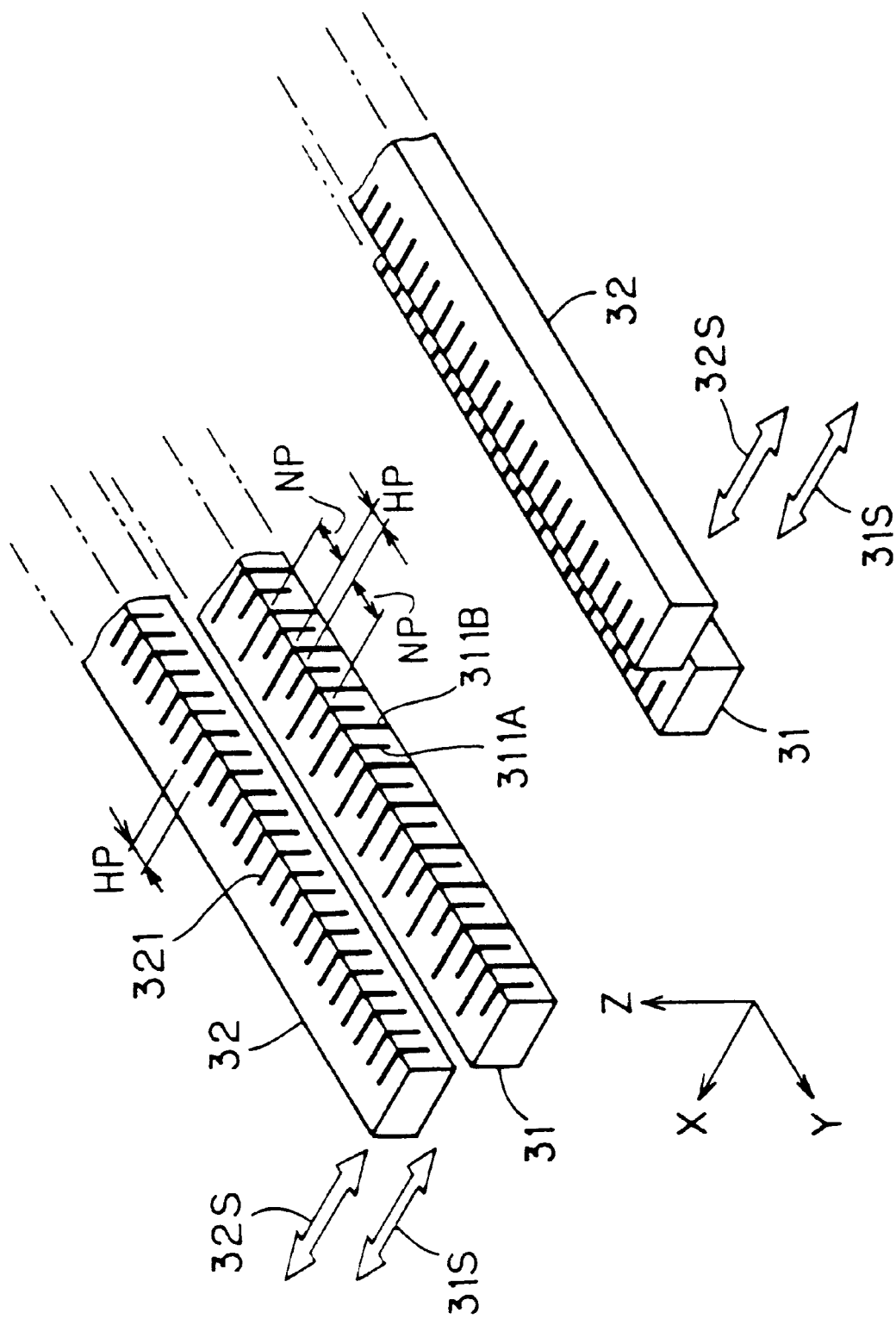

FIG.5
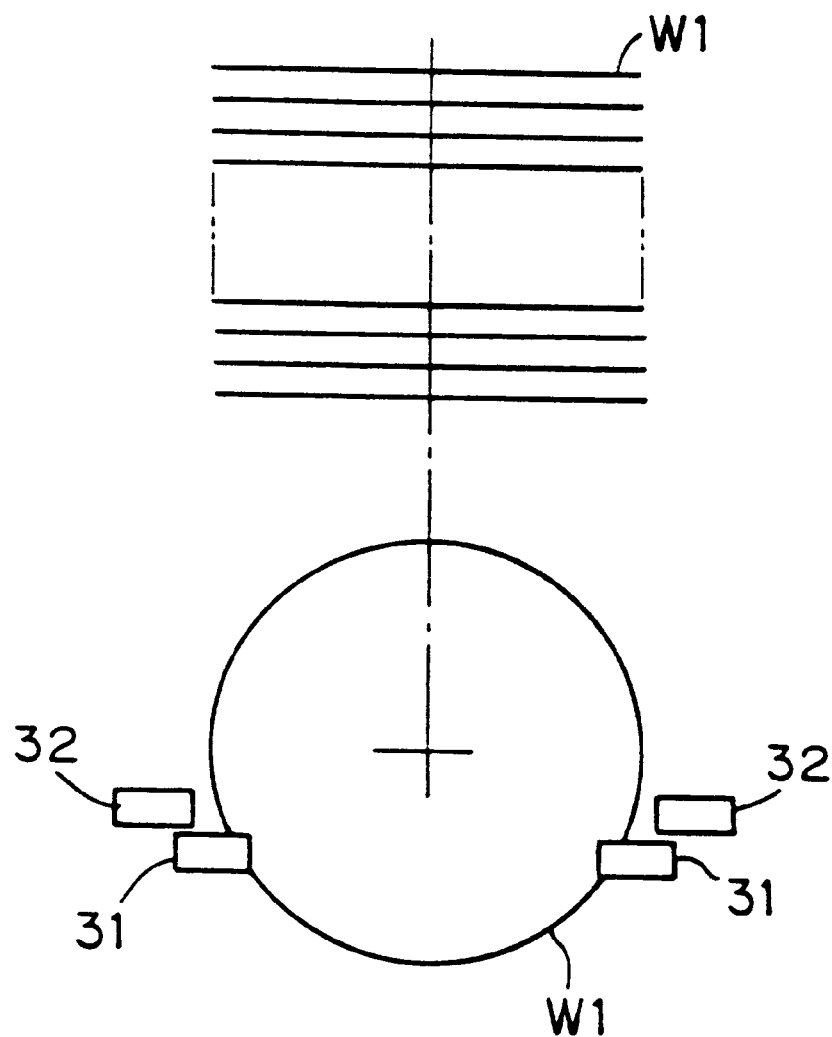
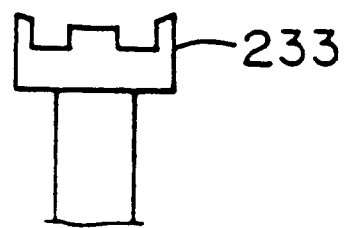

FIG. 8
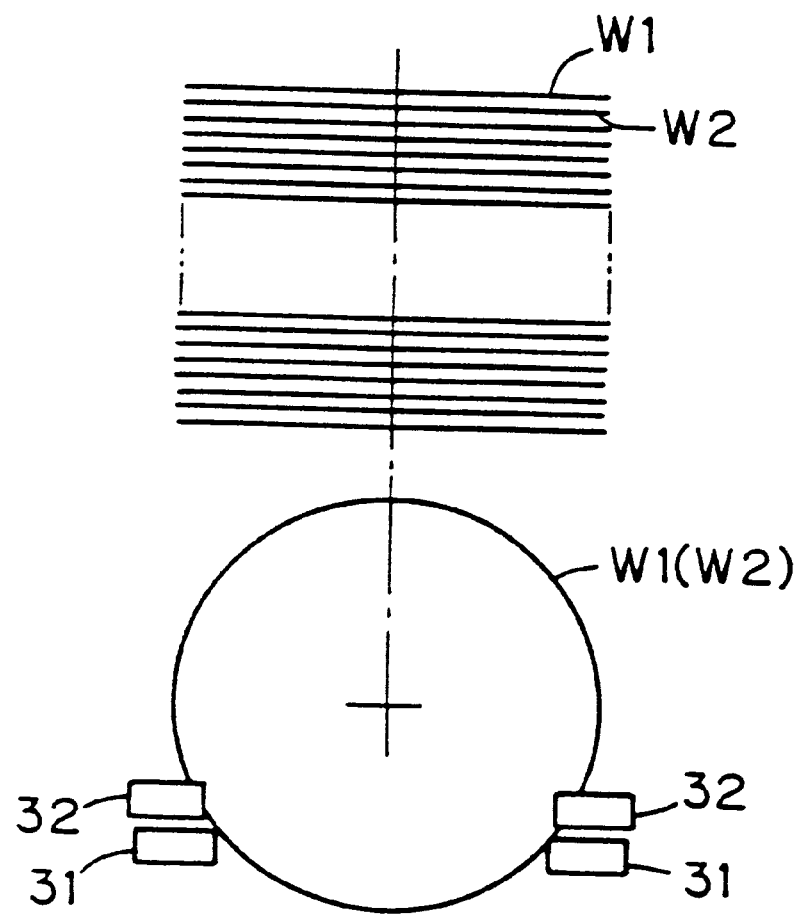
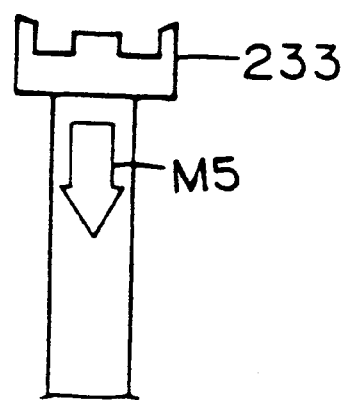

FIG. 15
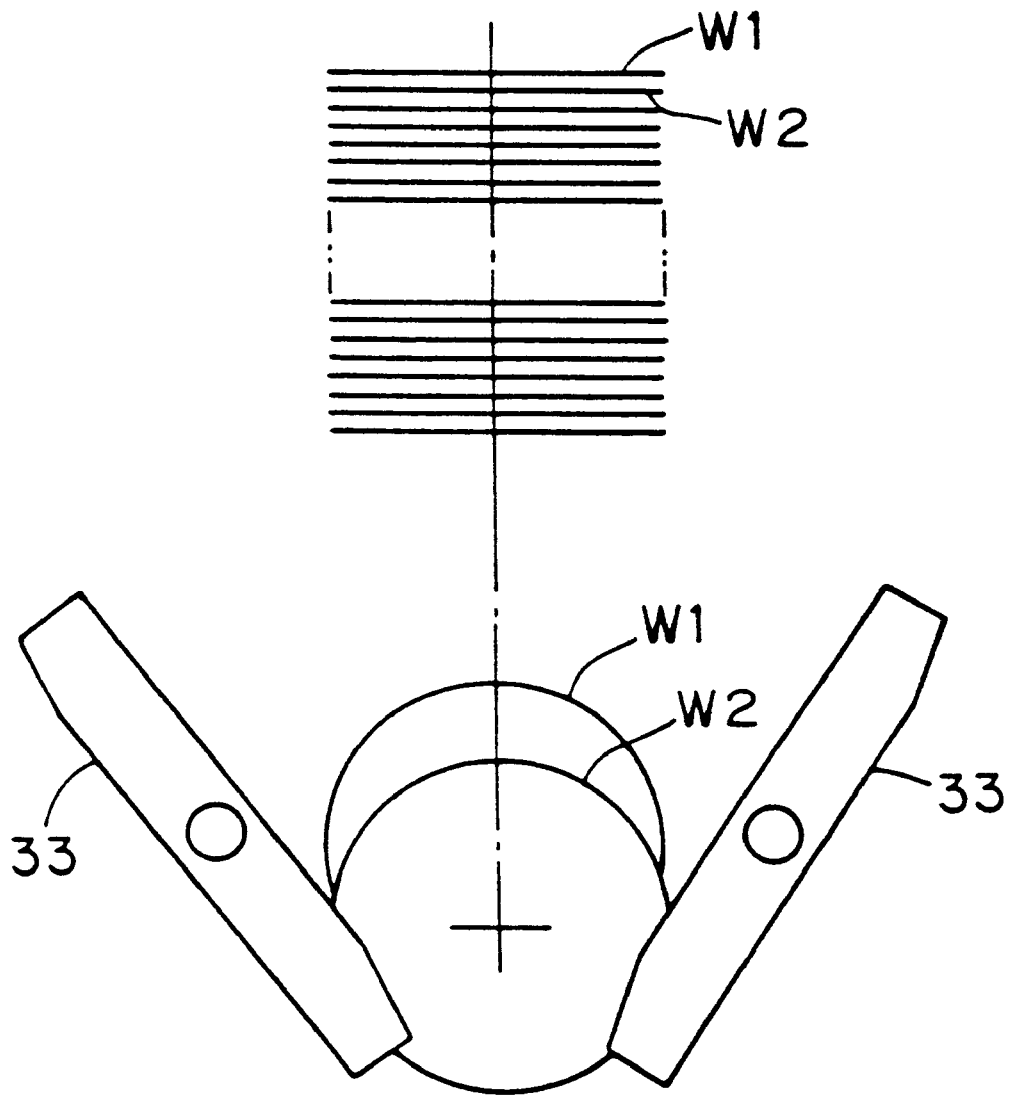
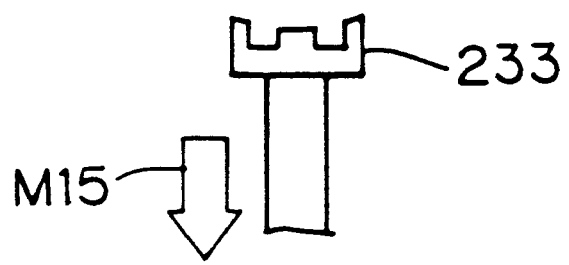

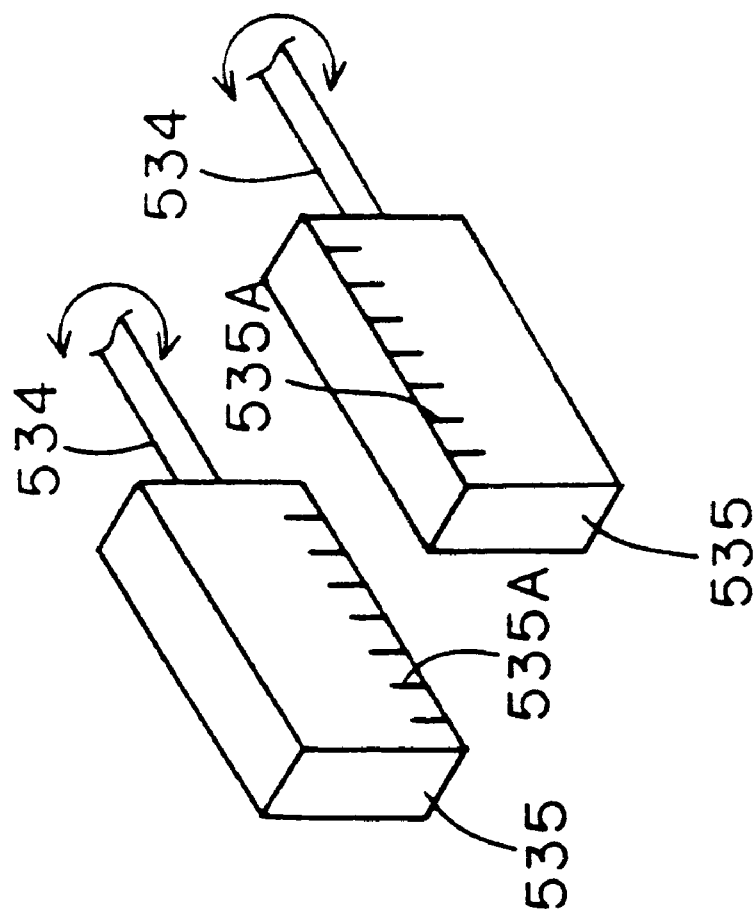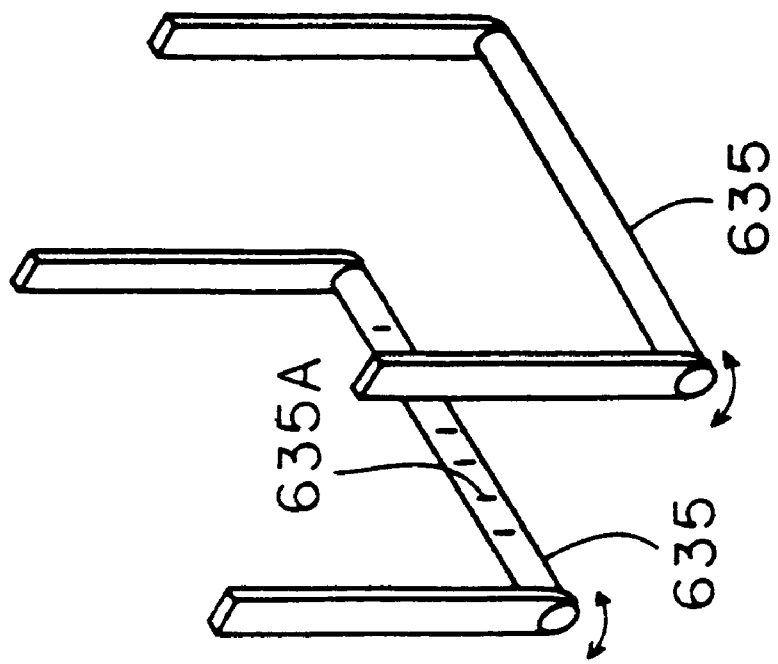
FIG. 33(b)
FIG. 33(a)

SUBSTRATE PROCESSING APPARATUS

TECHNICAL FIELD

The present invention relates to a substrate processing apparatus which performs predetermined processing on substrates for semiconductor device fabrication and substrates for use in fabrication of electronic parts such as liquid crystal display (which are referred simply as "substrates" hereinafter) and which transports a plurality of substrates between a cassette capable of receiving therein a plurality of substrate and processing means for performing predetermined processing on substrates.

BACKGROUND ART

Typically, a cassette which accommodates a plurality of substrates arranged in parallel is used when substrates are transported into and out of a substrate processing apparatus. Historically, in the case of a substrate processing apparatus which collectively takes out a plurality of substrates from a cassette to handle the substrates, a substrate transport robot of the substrate processing apparatus grasps and transports a plurality of substrates as one substrate group, with the pitch (spacing of arranged substrates) of the substrates which are received in the cassette maintained as it is.

FIG. 33 is a perspective view of parts of a substrate transport robot which hold substrates in a prior art substrate processing apparatus. In the substrate transport robot shown in FIG. 33(a), two rod-shaped members 635 are swingably provided to freely change the spacing therebetween. The two rod-shaped members 635 have grooves 635A cut at a predetermined pitch. The substrates are held by fitting the sides of the outer peripheries of the substrates to be transported into the grooves 635A while the spacing between the pair of rod-shaped members 635 is reduced.

On the other hand, the substrate transport robot shown in FIG. 33(b) includes two plate-shaped members 535 each of which is rotatable on a shaft 534. Each of the two plate-shaped members 535 has grooves 535A formed on opposite surfaces thereof at a predetermined pitch. The substrates are held by fitting the sides of the outer peripheries of the substrates to be transported into the grooves 535A while the pair of plate-shaped members 535 are rotated.

Therefore, the substrate transport robot shown in FIG. 33(a) has one area for holding the substrates, and the substrate transport robot shown in FIG. 33(b) has two such areas provided respectively in front and back surfaces of the plate-shaped members 535.

In a substrate processing apparatus which employs predetermined processing liquids stored in a plurality of processing baths to sequentially repeat the steps of dipping substrates in the processing liquids to perform a series of processes, the states of the substrates to be transported change in a step-by-step manner. When the substrate transport robot shown in FIG. 33(a), for example, is used in such a substrate processing apparatus, the substrates which have not yet been cleaned, the substrates being cleaned, and the substrates which have already been cleaned are held by the one area. Thus, for example, if the substrates transported into the apparatus are contaminated with particles and the like, the contamination is transferred to the substrates being cleaned or the cleaned substrates. Further, droplets of cleaning fluid deposited on the substrates being subjected to cleaning processing are sometimes deposited on the cleaned substrates. This results in the contamination of the substrates which have already been subjected to the cleaning processing to cause the problem of reduction in yield of the substrates in the cleaning processing.

The use of the substrate transport robot shown in FIG. 33(b) which has the two areas for holding the substrates slightly alleviates such a problem but still does not solve the problem of the contamination of the substrates which have already been subjected to the cleaning processing.

In some cases, it is desired to use a cassette having a pitch different from a conventional pitch in accordance with the number and types of substrates to be processed. However, since the pitch of the substrates that the substrate transport robot is capable of grasp is previously determined depending on the pitch of grooves cut in a grasping hand of the substrate transport robot, the use of the cassette having a different pitch requires the use of an apparatus designed specifically for pitch change. In this case, the size of the whole substrate processing apparatus increases, and the costs thereof also increase.

Further, cassettes actually have unnecessarily large substrate pitches, and the handling of the substrates with the pitches kept in this state might result in the increased size of the substrate processing apparatus or an insufficient throughput.

Then, in such a case, a technique has been used which employs, in addition to the substrate processing apparatus, an apparatus for changing the pitch of the substrates for handling of the substrates arranged at a pitch suitable for the substrate processing apparatus, wherein the substrates are once transferred to a specifically designed cassette that is capable of receiving therein the substrates at a smaller pitch and then the specifically designed cassette is transported into the substrate processing apparatus.

However, the above described technique wherein the substrates are transferred from the conventional cassette to the specifically designed cassette having the smaller pitch by using the pitch changing apparatus requires the transfer of the substrates in the pitch changing apparatus and the transport of the specifically designed cassette between the pitch changing apparatus and the substrate processing apparatus. This causes problems such as the generation and deposition of particles and the contamination of the substrates.

On the other hand, if the pitch changing apparatus is incorporated as it is into the substrate processing apparatus, another problem occurs that is the increased size of the substrate processing apparatus with the increase in space for handling of the specifically designed cassette. Additionally, in this case, it is necessary to make a controllable connection between the substrate processing apparatus and the pitch changing apparatus incorporated in the substrate processing apparatus.

DISCLOSURE OF THE INVENTION

The present invention has been made to solve the above described problems. It is an object of the present invention to provide a substrate processing apparatus which requires no specifically designed cassettes and which is prevented from increasing in size by ingeniously introducing a pitch changing mechanism into the substrate processing apparatus, thereby achieving the improvements in substrate quality and the fabrication of economical substrates.

It is another object of the present invention to provide a substrate processing apparatus which is capable of transporting substrates arranged at different pitches without using an apparatus specifically designed for changes in pitch.

It is still another object of the present invention to provide a substrate processing apparatus which is capable of readily maintaining the cleanliness of substrates after predetermined processing.

The present invention is intended for a substrate processing apparatus for performing predetermined processing on a group of substrates arranged in parallel at a first pitch, which comprises: a) processing means for performing the predetermined processing upon the group of substrates; b) cassette moving means for sequentially moving a plurality of cassettes to a plurality of transfer positions which are displaced by the first pitch from each other, each of the cassettes being capable of receiving a predetermined number of substrates arranged in an upright attitude at a second pitch which is an integral multiple of the first pitch; and c) transfer means for holding the predetermined number of substrates in each of the plurality of transfer positions and vertically moving the predetermined number of substrates to take out the predetermined number of substrates from the plurality of cassettes and to insert the predetermined number of substrates into the plurality of cassettes; and d) transport means for holding the group of substrates in an upright attitude to transport the group of substrates between the transfer means and the processing means while holding the group of substrates, wherein the transport means receives sequentially a plurality of times the predetermined number of substrates in association with the plurality of transfer positions from the transfer means to hold substrates which have been received in the plurality of cassettes and which have not yet been subjected to the predetermined processing as the group of substrates, and wherein the transfer means repeats a plurality of times the operation of receiving the predetermined number of substrates from among the group of substrates subjected to the predetermined processing and held by the transport means to introduce the predetermined number of substrates into each of the plurality of cassettes sequentially moved to the plurality of transfer positions, thereby to insert the group of substrates into the plurality of cassettes.

Since the predetermined number of substrates are transferred the plurality of times in association with the plurality of transfer positions between the transfer means and the transport means, the transfer of substrates is achieved between the cassette capable of receiving the predetermined number of substrates arranged at the second pitch and the transport means capable of holding the plurality of substrates arranged at the first pitch. This eliminates the need to provide an additional apparatus for changing pitches externally of the substrate processing apparatus, reducing the deposition of particles to the substrates, the generation of particles, and damages to the substrates. Additionally, the present invention allows a simplified control system and prevents the increase in size of the substrate processing apparatus itself, as compared with a substrate processing apparatus connected to the pitch changing apparatus.

The present invention is also intended for a substrate processing apparatus for transporting a plurality of substrates between a cassette capable of receiving the plurality of substrates and processing means for performing predetermined processing on substrates, which comprises: a) two retaining columns having a plurality of retaining areas for holding an outer periphery of each of the plurality of substrates sideways, and b) a retention driving mechanism for causing the two retaining columns to perform a holding operation, wherein the plurality of retaining areas are defined by dividing a side surface of each of the retaining columns in a circumferential direction about an axis of each retaining column, wherein the processing means includes: liquid processing means for performing liquid processing using a predetermined processing liquid upon the plurality of substrates, and drying means for drying the plurality of substrates, and wherein the plurality of retaining areas include: an area for holding the plurality of substrates which have not yet been subjected to the liquid processing, an area for holding the plurality of substrates which are being subjected to the liquid processing, and an area for holding the plurality of substrates which have already been dried.

The provision of the special-purpose areas in accordance with the processing states of the substrates prevents contamination from being transferred to the dried substrates if the substrates which are transported into the apparatus and have not yet been subjected to the predetermined processing are contaminated, thereby to readily maintain the cleanliness of the substrates which have been subjected to the predetermined processing. Additionally, the deposition of the liquid from the substrates which are being subjected to the liquid processing onto the dried substrates is prevented. As a result, the cleanliness of the substrates which have been subjected to the predetermined processing is readily maintained.

The present invention is also intended for a substrate processing apparatus for transporting a plurality of substrates between a cassette capable of receiving the plurality of substrates and processing means for performing predetermined processing on substrates, which comprises: a) two retaining columns having a plurality of retaining areas for holding an outer periphery of each of the plurality of substrates sideways, and b) a retention driving mechanism for causing the two retaining columns to perform a holding operation, wherein the plurality of retaining areas are defined by dividing a side surface of each of the retaining columns in a circumferential direction about an axis of each retaining column, and wherein the plurality of retaining areas include an area wherein grooves having a first pitch are formed, and an area wherein grooves having a second pitch different from the first pitch are formed.

The presence of the area wherein the grooves having the first pitch are formed and the area wherein the grooves having the second pitch different from the first pitch are formed allows the transport of the substrates arranged at different pitches without the use of an apparatus specifically designed for pitch changes.

BRIEF DESCRIPTION OF DRAWINGS

FIG. 1(*b*) is a fragmentary view showing a push-up portion with cassettes placed thereon;

FIGS. 2(*a*) and 2(*b*) show the operation of transferring substrates between a pushup mechanism and a substrate transport robot;

FIG. 3 is a perspective view of retaining bars;

FIG. 5 shows one state of the operation of transferring the substrates by means of the push-up base of the push-up mechanism and the retaining bars of FIG. 3;

FIG. 8 shows one state of the operation of transferring the substrates by means of the push-up base of the push-up mechanism and the retaining bars of FIG. 3;

FIG. 15 shows one state of the operation of transferring the substrates by means of the push-up base of the push-up mechanism and the retaining plates of FIG. 9;

FIG. 33 is a perspective view of parts of a substrate transport robot which hold substrates in a prior art substrate processing apparatus.

BEST MODE FOR CARRYING OUT THE INVENTION

<1. First Embodiment>

Figure 1A:
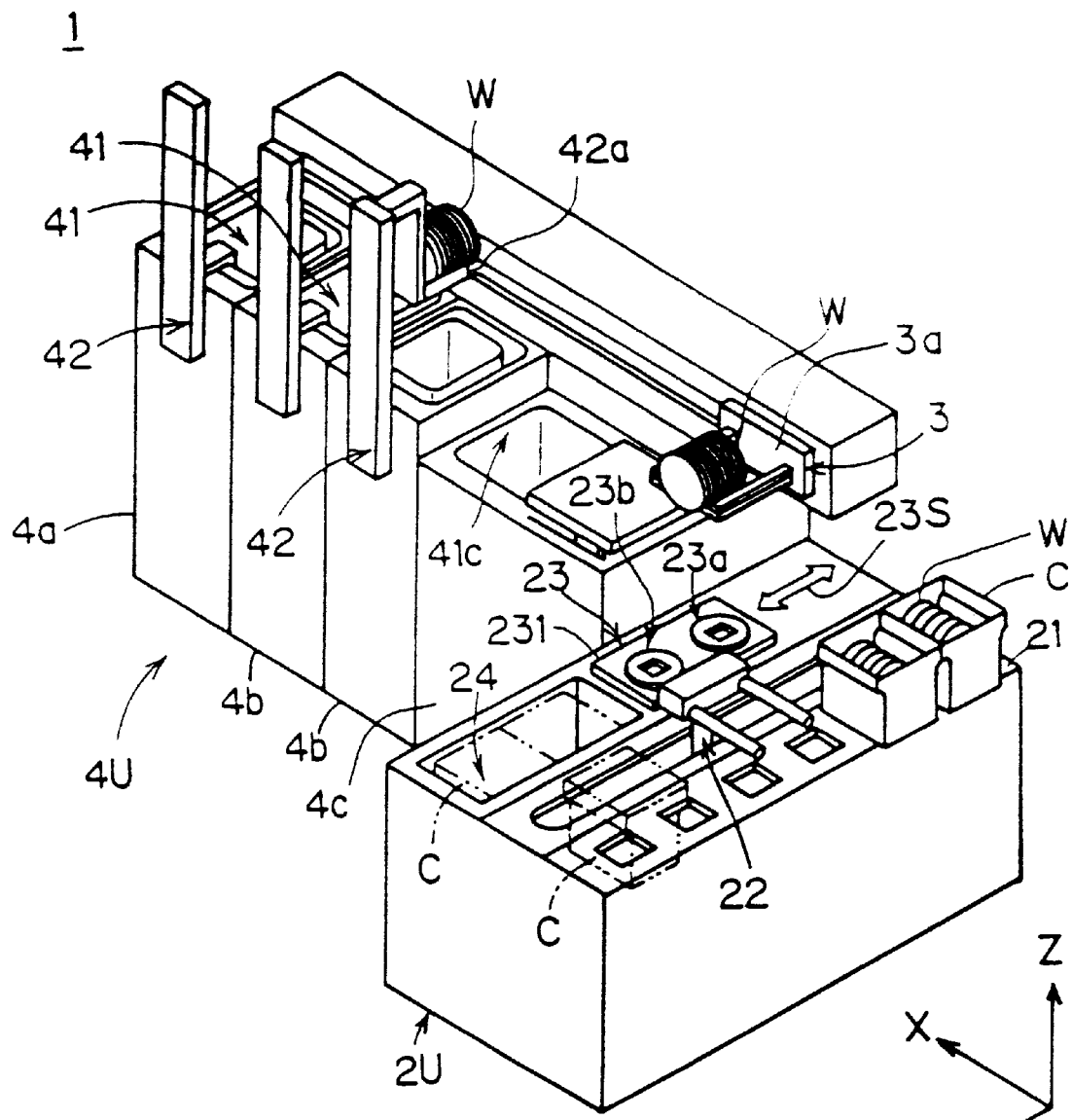
FIG. 1(*a*) is a perspective overall view of a substrate processing apparatus according to a first embodiment of the present invention.

FIG. 1(a) is a perspective overall view of a substrate processing apparatus 1 according to a first embodiment of the present invention.

The substrate processing apparatus 1 is an apparatus for performing cleaning processing on substrates W, and generally comprises a cassette rest unit 2U to and from which the substrates W received in cassettes C are transported, a cleaning processing unit 4U for performing the cleaning processing on the substrates W, and a substrate transport robot 3 for transporting the substrates W between the cassette rest unit 2U and the cleaning processing unit 4U.

The cassette rest unit 2U includes a cassette rest portion 21 onto which the cassettes C from the exterior of the apparatus are transported and placed, a cassette transfer robot 22 for transferring the cassettes C, a push-up portion 23 onto which the cassettes C are placed by the cassette transfer robot 22, and a cassette cleaning portion 24 for cleaning the cassettes C. The substrates W transported into the substrate processing apparatus 1 is adapted to be passed from the push-up portion 23 to the substrate transport robot 3. Conversely, the substrates W received from the substrate transport robot 3 are permitted to be inserted in the cassettes C and then introduced onto the cassette rest portion 21.

The cleaning processing unit 4U includes a pre-cleaning portion 4a for performing preceding-step cleaning processing, two post-cleaning portions 4b for performing succeeding-step cleaning processing, and a drying portion 4c for drying the cleaned substrates W. Upon being transferred by the substrate transport robot 3, the substrates W pass through the pre-cleaning portion 4a, one of the post-cleaning portions 4b, and the drying portion 4c in sequential order and are then transported to the cassette rest unit 2U.

The construction of the substrate processing apparatus 1 has been described hereinabove. Next, the operation of the substrate processing apparatus 1 will be described in conjunction with the respective structures.

The substrates W are transported into the substrate processing apparatus 1 by using the cassettes C. Each of the cassettes C may receive a plurality of substrates W arranged in parallel in an upright attitude, with the distance between the substrates W set at a normal pitch NP. The cassettes C are transported to the substrate processing apparatus 1 by means of an auto-guided vehicle (not shown) and the like, and then arranged and placed on the cassette rest portion 21 in the Y direction shown in FIG. 1.

When the cassettes C are placed on the cassette rest portion 21, two of these cassettes C are placed on the push-up portion 23 by the cassette transfer robot 22. Two cassettes C which rest on the push-up portion 23 are shown in fragmentary view of FIG. 1(b).

The push-up portion 23 has two push-up mechanisms 23a and 23b so that two cassettes C are arranged and placed thereon in the Y direction. These push-up mechanisms 23a and 23b are provided on a movable base 231 moved by a movement driving mechanism not shown. This allows the two push-up mechanisms 23a and 23b to move in the Y direction as indicated by the arrow 23S of FIG. 1. Each of the two pushup mechanisms 23a and 23b has a rotary base 232 and a push-up base 233 as shown in FIG. 2 (although only the push-up mechanism 23a is shown in FIG. 2) and is adapted such that, as the rotary base 232 rotates on an axis oriented in the Z direction, the associated cassette C is also rotated. The push-up base 233 moves vertically so as to push up the substrates W through an opening Ca at the bottom of the cassettes C.

Figure 1B:
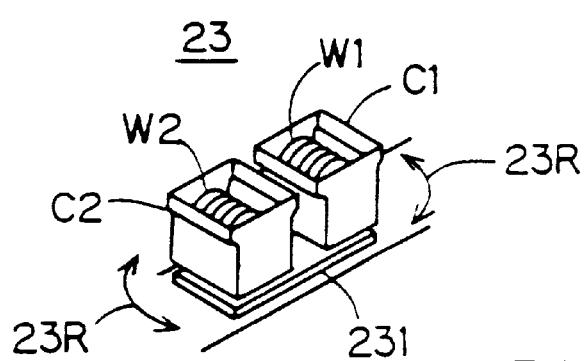

When the two cassettes C (between which a distinction is made, if required, by referring to one of the cassettes which is placed on the push-up mechanism 23a as a "cassette C1" and the other cassette placed on the push-up mechanism 23b as a "cassette C2") are placed on the push-up portion 23, the movable base 231 is initially moved to move the push-up mechanism 23a to a position under the transport robot 3, and the rotary base 232 of the push-up mechanism 23a is then rotated as indicated by the arrows 23R of FIG. 1(b) to change the orientation of the normal to the major surfaces of a predetermined number of substrates W in the cassette C1 (distinguished from substrates W in the cassette C2, if required, by referring to the substrates associated with the cassette C1 as "substrates W1" and the substrates associated with the cassette C2 as "substrates W2") from the X direction to the Y direction.

Next, the push-up base 233 of the push-up mechanism 23a moves upwardly and the substrates W1 are passed to the substrate transport robot 3. Then, the push-up base 233 moves downwardly.

When the transfer of the substrates W1 from the push-up mechanism 23a is completed, the movable base 231 is moved to move the push-up mechanism 23b to the position under the substrate transport robot 3. In a manner described with respect to the push-up mechanism 23a, the orientation of the cassette C2 is changed, and the substrates W2 are pushed up and then passed to the substrate transport robot 3.

As above described, the substrates W1 and W2 which have been received in the two cassettes C1 and C2 are passed to the substrate transport robot 3. The substrates W passed to the substrate transport robot 3 are held as a substrate group consisting of a predetermined number of substrates W1 and a predetermined number of substrates W2 which are arranged in parallel at a half pitch. That is, the substrates W1 and W2 which have been arranged in parallel at the normal pitch in the two cassettes C1 and C2 respectively are held as a group of substrates arranged in parallel in an upright attitude at the half pitch which is one-half the normal pitch.

The operation of the transfer of the substrates W between the push-up portion 23 and the substrate transport robot 3 will be described later in detail.

Upon receipt of the substrates W from the push-up portion 23, the substrate transport robot 3 transports the substrates W to the pre-cleaning portion 4a. The pre-cleaning portion 4a includes a bath 41 for storing therein a cleaning liquid which is a solution mixture of sulfuric acid and an aqueous solution of hydrogen peroxide, and an elevating robot 42 (illustrated at the post-cleaning portions 4b in FIG. 1) for elevating and lowering an elevating base 42a. The substrate transport robot 3 passes the substrates W to the elevating base 42a, and the elevating robot 42 lowers the elevating base 42a to dip the substrates W in the cleaning liquid, whereby the preceding-step cleaning processing is performed on the substrates W.

When the preceding-step cleaning processing performed on the substrates W is completed, the elevating robot 42 elevates the elevating base 42a out of the bath 41 and passes the substrates W to the substrate transport robot 3.

Upon receipt of the substrates W from the pre-cleaning portion 4a, the substrate transport robot 3 transports the substrates W to one of the post-cleaning portions 4b. Each of the post-cleaning portions 4b includes a bath 41 for storing therein a cleaning liquid which is, for example, a solution mixture of aqueous ammonia and an aqueous solution of hydrogen peroxide, and an elevating robot 42 for elevating and lowering an elevating base 42a. In a manner described with respect to the pre-cleaning portion 4a, the substrate transport robot 3 passes the substrates W to the elevating base 42a, and the elevating robot 42 lowers the elevating base 42a to dip the substrates W in the cleaning liquid, whereby the succeeding-step cleaning processing is performed on the substrates W.

When the succeeding-step cleaning processing performed on the substrates W is completed, the elevating robot 42 elevates the elevating base 42a and passes the substrates W to the substrate transport robot 3. Then, the substrate transport robot 3 transports the substrates W to the drying portion 4c.

The drying portion 4c includes an elevating robot (not show) which is similar in function to that of the pre-cleaning portion 4a, and a drying chamber 41c. The drying portion 4c receives the substrates W from the substrate transport robot 3, dries the substrates W in the drying chamber 41c, and passes the dried substrates W again to the substrate transport robot 3.

Upon receipt of the dried substrates W, the substrate transport robot 3 transports the substrates W to a position over the push-up portion 23. The push-up portion 23 receives the substrates W. The operations of the push-up portion 23 and the substrate transport robot 3 at this time are in reversed relation with the operations thereof performed when the substrates W are passed from the push-up portion 23 to the substrate transport robot 3. The substrates W held at the half pitch by the substrate transport robot 3 are inserted as respective predetermined numbers of substrates W1 and W2 arranged in parallel at the normal pitches in the two cassettes C1 and C2 on the push-up portion 23. Thereafter, the cassettes C1 and C2 are transferred to the cassette rest portion 21 by the cassette transfer robot 22. During the cleaning of the substrates W, the empty cassettes C1 and C2 on the push-up portion 23 are transported by the cassette transfer robot 22 to the cassette cleaning portion 24, subjected to cleaning processing in the cassette cleaning portion 24, and placed again on the push-up portion 23. Thus, the cleaned substrates W are received in the cleaned cassettes C1 and C2.

The overall construction and schematic operation of the substrate processing apparatus 1 according to the present invention have been described hereinabove. Next, the transfer of the substrates W1 and W2 from the push-up portion 23 to the substrate transport robot 3 will be described.

FIG. 3 shows parts of the substrate transport robot 3 which hold the substrates W. The substrate transport robot 3 which is movable in the X direction shown in FIG. 1 has four rod-shaped retaining bars extending in the Y direction. These retaining bars hold the outer peripheries of the substrates W1 and W2 to retain the substrates W in the upright attitude.

As shown in FIG. 3, the retaining bars include a pair of lower retaining bars 31 and a pair of upper retaining bars 32. A main body portion 3a (retention driving mechanism) of the substrate transport robot 3 causes the opening and closing movement of the pair of lower retaining bars 31 in the X direction as indicated by arrows 31S. The main body portion 3a of the substrate transport robot 3 also causes the opening and closing movement of the pair of upper retaining bars 32 in the X direction as indicated by arrows 32S. The retaining bars 31 have grooves formed therein for holding the substrates W in the upright attitude. The grooves include shallow grooves 311A and deep grooves 311B arranged alternately at the half pitch HP. That is, the grooves 311A themselves are arranged at the normal pitch NP, and the grooves 311B themselves are arranged at the normal pitch NP. The array of grooves 311A and the array of grooves 311B are arranged with a deviation of the half pitch HP. On the other hand, the retaining bars 32 have grooves 321 all having the same configuration and arranged at the half pitch HP.

Figure 4:
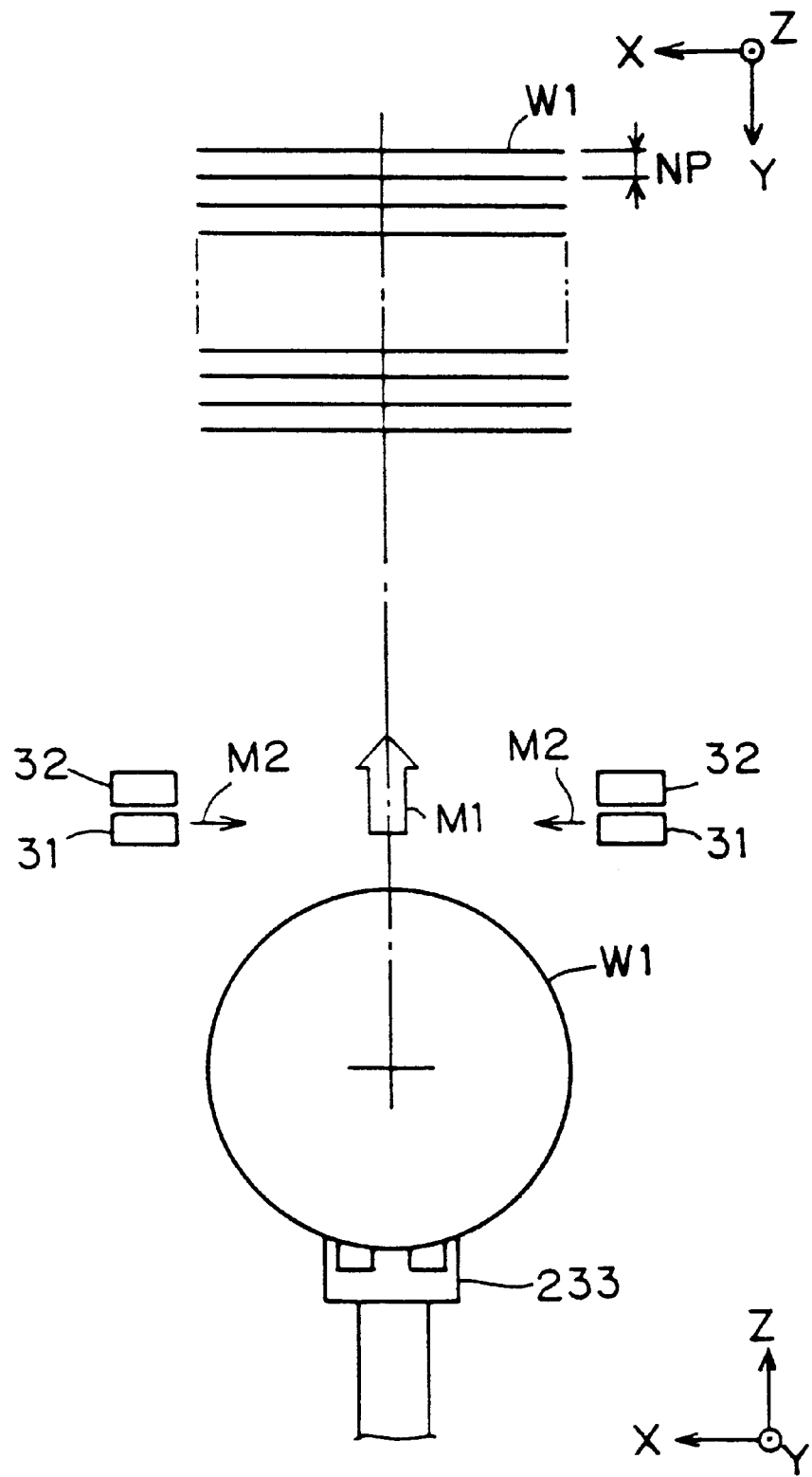
FIG. 4 shows one state of the operation of transferring the substrates by means of a push-up base of the push-up mechanism and the retaining bars of FIG. 3.

In the operation of the transfer of the substrates from the push-up portion 23 to the substrate transport robot 3 having the above described retaining bars 31 and 32, the push-up mechanism 23a with the cassette C1 placed thereon is initially positioned under the substrate transport robot 3. The upper surface of the push-up base 233 is formed with grooves into which the outer peripheries of the substrates W1 are fitted for retention of the substrates W in the upright attitude. As the push-up base 233 rises, the substrates W1 are pushed up toward the substrate transport robot 3 while being maintained in the upright attitude. FIG. 4 shows the substrates W1 in this state, with a centerline shown as associating the substrates W1 as viewed from the front and the substrates W1 as viewed from above with each other. The substrates W1 and W2 of FIGS. 5 through 8 are also shown in the same manner.

As shown in FIG. 4, the substrates W1 are pushed up as indicated by an arrow M1. When the substrates W1 is pushed up to a predetermined level, the pair of retaining bars 31 move to decrease the spacing therebetween as indicated by an arrow M2. Thereafter, the push-up base 233 lowers, and the substrates W1 are held in such a manner that the outer peripheries of the substrates W1 are fitted in the grooves of the retaining bars 31. At this time, the substrates W1 arranged in the Y direction at the normal pitch NP are held in the shallow grooves 311A formed in the retaining bars 31. The substrates W1 held by the retaining bars 31 are shown in FIG. 5.

Figure 6:
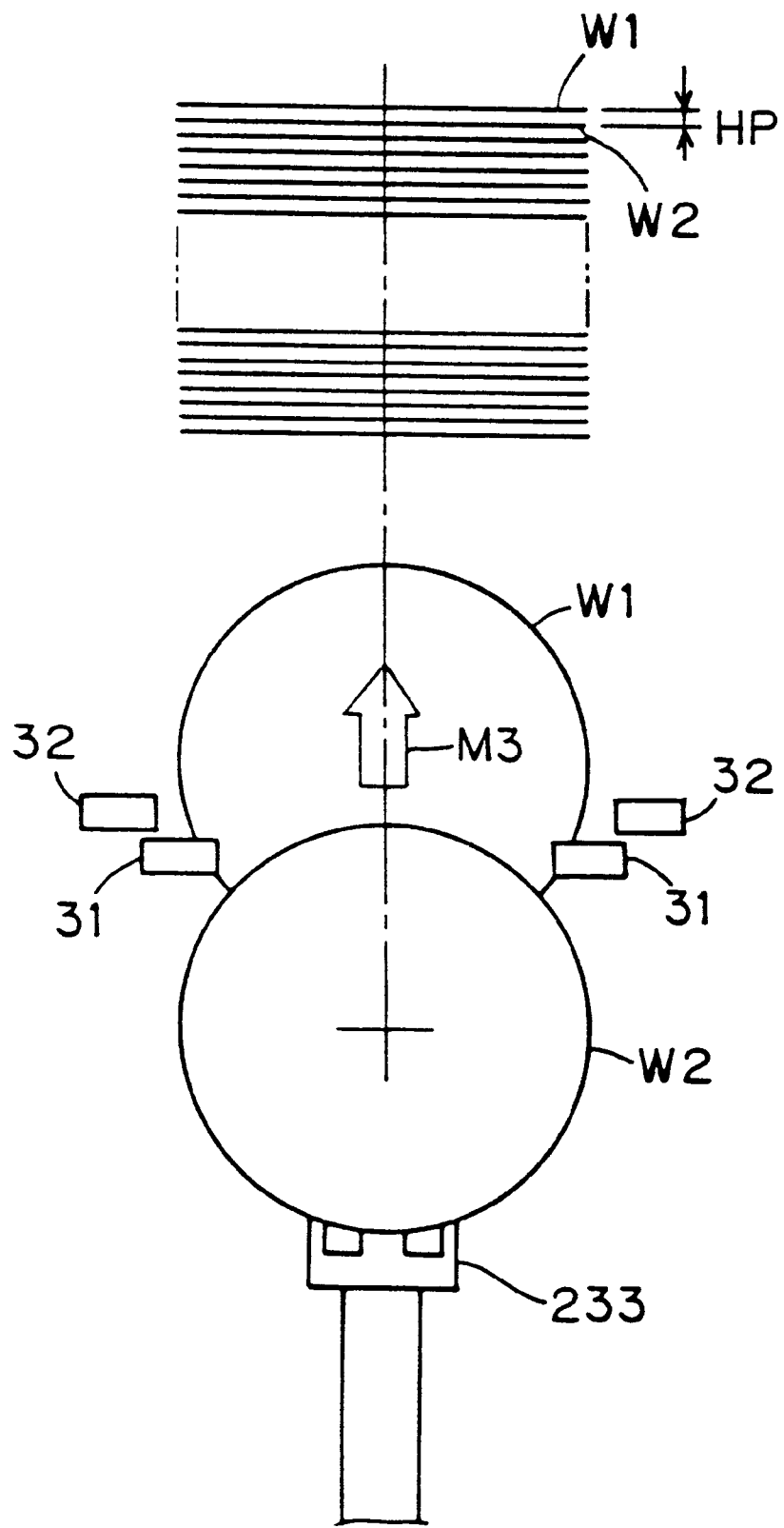
FIG. 6 shows one state of the operation of transferring the substrates by means of the push-up base of the push-up mechanism and the retaining bars of FIG. 3.

When the substrates W1 are held by the retaining bars 31, the push-up base 233 moves further downwardly. The movable base 231 moves until the push-up mechanism 23b with the cassette C2 placed thereon is positioned under the substrate transport robot 3. At this time, the position of the substrates W2 received in the cassette C2 on the push-up mechanism 23b is shifted by the half pitch HP in the Y direction from the position of the substrates W1 held by the retaining bars 31. That is, the substrates W1 held by the retaining bars 31 and the substrates W2 on the push-up mechanism 23b as viewed from above are arranged alternately at the half pitch HP. Thereafter, as shown in FIG. 6, the substrates W2 on the push-up mechanism 23b are pushed upwardly by the push-up base 233 as indicated by an arrow M3, and the substrates W2 on the push-up base 233 enter the spaces between the plurality of substrates W1 held by the retaining bars 31. At this time, since the position of the substrates W2 in the Y direction is in alignment with the deep grooves 311B of the retaining bars 31, the substrates W2 moved upwardly by the push-up base 233 are pushed upwardly through the grooves 311B of the retaining bars 31 without contacting the retaining bars 31.

Figure 7:
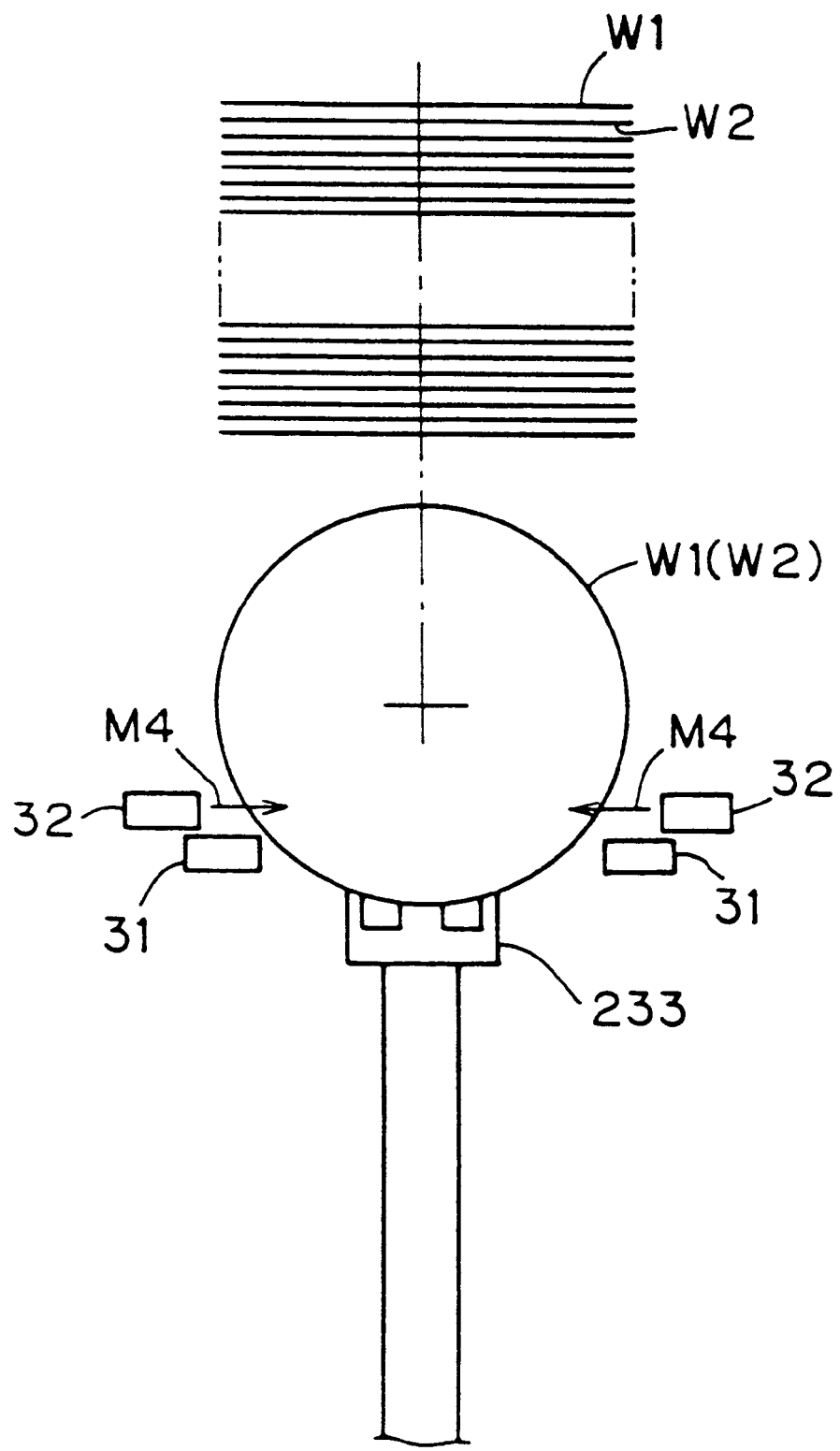
FIG. 7 shows one state of the operation of transferring the substrates by means of the push-up base of the push-up mechanism and the retaining bars of FIG. 3.

As the push-up base 233 further rises, the substrates W1 held by the retaining bars 31 come into contact with the push-up base 233 and are pushed up. This allows the substrates W1 and the substrates W2 to be arranged at the half pitch HP on the push-up base 233, as shown in FIG. 7. The push-up base 233 of the push-up mechanism 23b is formed with grooves arranged at the half pitch HP for holding the outer peripheries of the substrates W1 and W2 fitted therein for retention of the substrates W1 and W2 in the upright attitude at the half pitch HP. Then, when the pair of retaining bars 32 are moved to decrease the spacing therebetween as indicated by arrows M4 and the retaining base 233 is lowered, the substrates W1 and W2 are held in such a manner that the outer peripheries of the substrates W1 and W2 are in contact with the grooves 321 arranged at the half pitch HP in the retaining bars 32. Thereafter, the push-up base 233 is further lowered as indicated by the arrow M5 of FIG. 8. The transfer of the substrates W1 and W2 from the push-up position 23 to the substrate transport robot 3 in conjunction with the pitch change is completed.

The operation of the transfer of the substrates W1 and W2 from the push-up portion 23 to the substrate transport robot 3 has been described hereinabove. This transfer operation allows the substrates W1 and W2 respectively received at the normal pitch NP in the two cassettes C1 and C2 on the push-up portion 23 to be held as a group of substrates at the half pitch HP by the retaining bars 32 of the substrate transport robot 3.

The substrates W received by the substrate transport robot 3 are transported to the pre-cleaning portion 4a of the cleaning processing unit 4U by the movement of the substrate transport robot 3 in the X direction shown in FIG. 1. When the substrates W are transported to the pre-cleaning portion 4a, the elevating base 42a is fully elevated and receives the substrates W held by the retaining bars 32. The spacing between the retaining bars 32 is widened, and then the elevating base 42a is lowered, whereby the substrates W are introduced into the bath 41. The substrate transport robot 3 performs the reverse operation to receive the substrates W from the pre-cleaning portion 4a, and performs the similar operation to transfer the substrates W to the post-cleaning portions 4b and the drying portion 4c.

The substrates W which have been subjected to the cleaning processing and the drying processing are transported again to the position over the push-up portion 23 by the substrate transport robot 3. The substrate transport robot 3 performs operations in reversed relation with the operation performed when the substrate transport robot 3 receives the substrates W1 and W2 from the push-up portion 23, to insert the substrates W1 and W2 therefrom into the two cassettes C1 and C2 on the push-up portion 23. Specifically, the push-up base 233 pushes up the substrates W (substrates W1 and W2) held by the retaining bars 31 and 32 and is then lowered with the spacing between the pair of retaining bars 32 widened, whereby only the substrates W2 are introduced into the cassette C2 while the substrates W1 are held by the retaining bars 31. Next, the movable base 231 is moved to move the push-up mechanism 23a to the position under the substrate transport robot 3. The push-up base 233 pushes up the substrates W1 and is then lowered with the spacing between the pair of retaining bars 31 widened, whereby the substrates W1 are introduced into the cassette C1. When the insertion of the substrates W1 and W2 into the two cassettes C1 and C2 is completed, the cassette transfer robot 22 is used to return the cassettes C1 and C2 to the cassette rest portion 21.

As described hereinabove, the substrate processing apparatus 1 employs the push-up portion 23 and the substrate transport robot 3 to render the arrangement of the substrates W changeable between the normal pitch and the half pitch. This eliminates the need to provide a pitch changing apparatus outside the substrate processing apparatus and to couple the pitch changing apparatus to the substrate processing apparatus. Therefore, the generation and deposition of particles on the substrates and the damages to the substrates due to the provision of the pitch changing apparatus outside the substrate processing apparatus are reduced. Furthermore, the problem of the increased size of the apparatus due to the coupling of the pitch changing apparatus to the substrate processing apparatus is eliminated.

<2. Second Embodiment>

Figure 9:
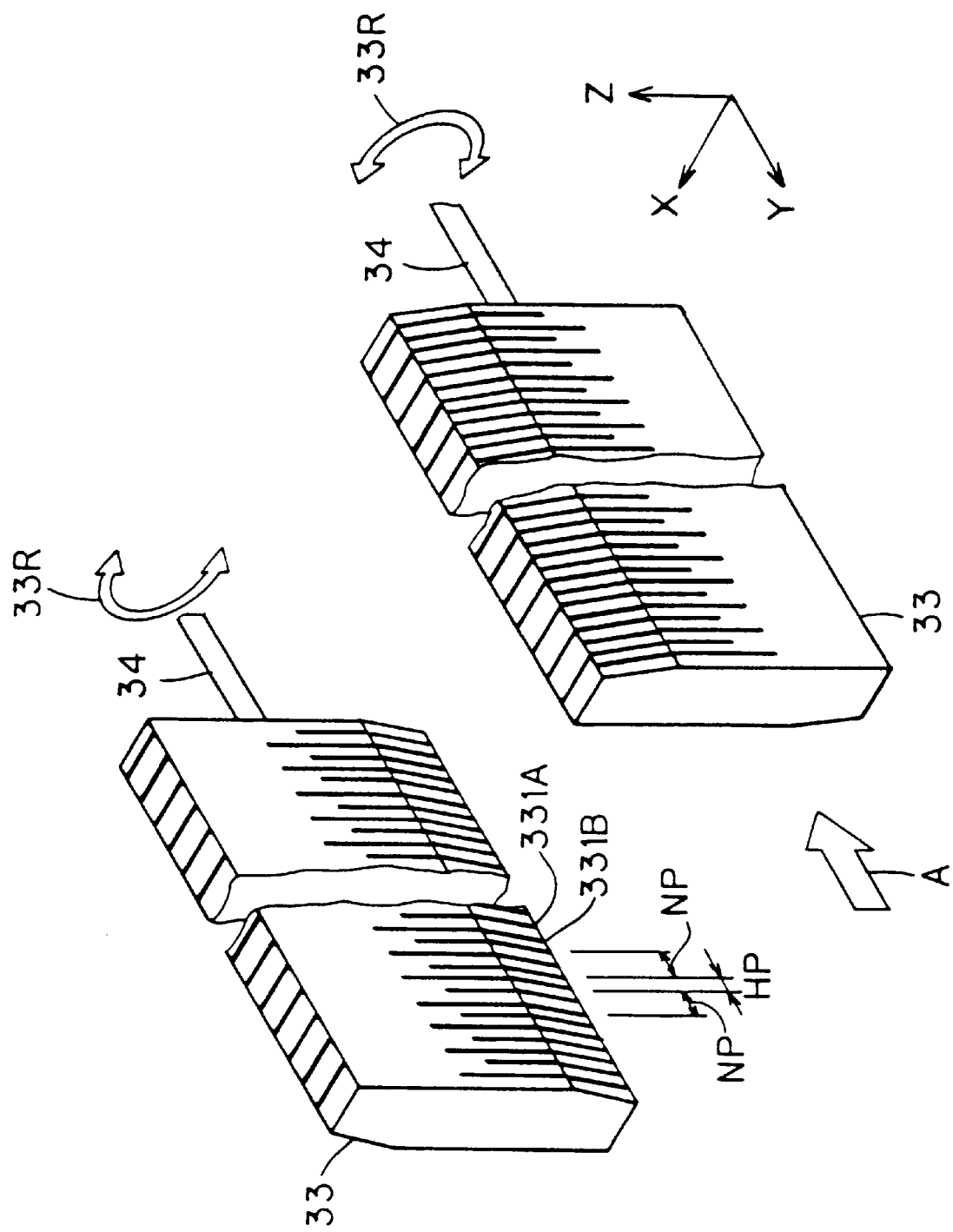
FIG. 9 is a perspective view of retaining plates of the substrate processing apparatus according to a second embodiment of the present invention.

FIG. 9 is a perspective view of parts of the substrate transport robot 3 which hold the substrates W in the substrate processing apparatus according to another embodiment of the present invention. Other parts are similar in construction to those of the substrate processing apparatus 1 of the first embodiment, and are described using similar reference characters.

Although the substrate transport robot 3 in the first embodiment has the four retaining bars 31 and 32 extending in the Y direction, this substrate processing apparatus includes a pair of retaining plates 33 elongated in the Y direction as shown in FIG. 9. These retaining plates 33 are connected through respective shafts 34 extending in the Y direction to the main body portion 3a of the substrate transport robot 3 which serves as a retention driving mechanism, and are adapted to rotate on the shafts 34 in the directions opposite from each other as indicated by arrows 33R.

The retaining plates 33 are formed with shallow grooves 331A and deep grooves 331B arranged alternately in the Y direction, with the spacings therebetween defined at the half pitch HP. That is, the grooves 331A themselves are arranged at the normal pitch NP in the Y direction, and the grooves 331B themselves are arranged at the normal pitch NP in the Y direction in the spaces between the grooves 331A. These grooves are formed in opposite surfaces of each of the retaining plates 33. When the retaining plates 33 rotate 180° on the shafts 34, the grooves in the back surfaces thereof appear in the front position.

Figure 10:
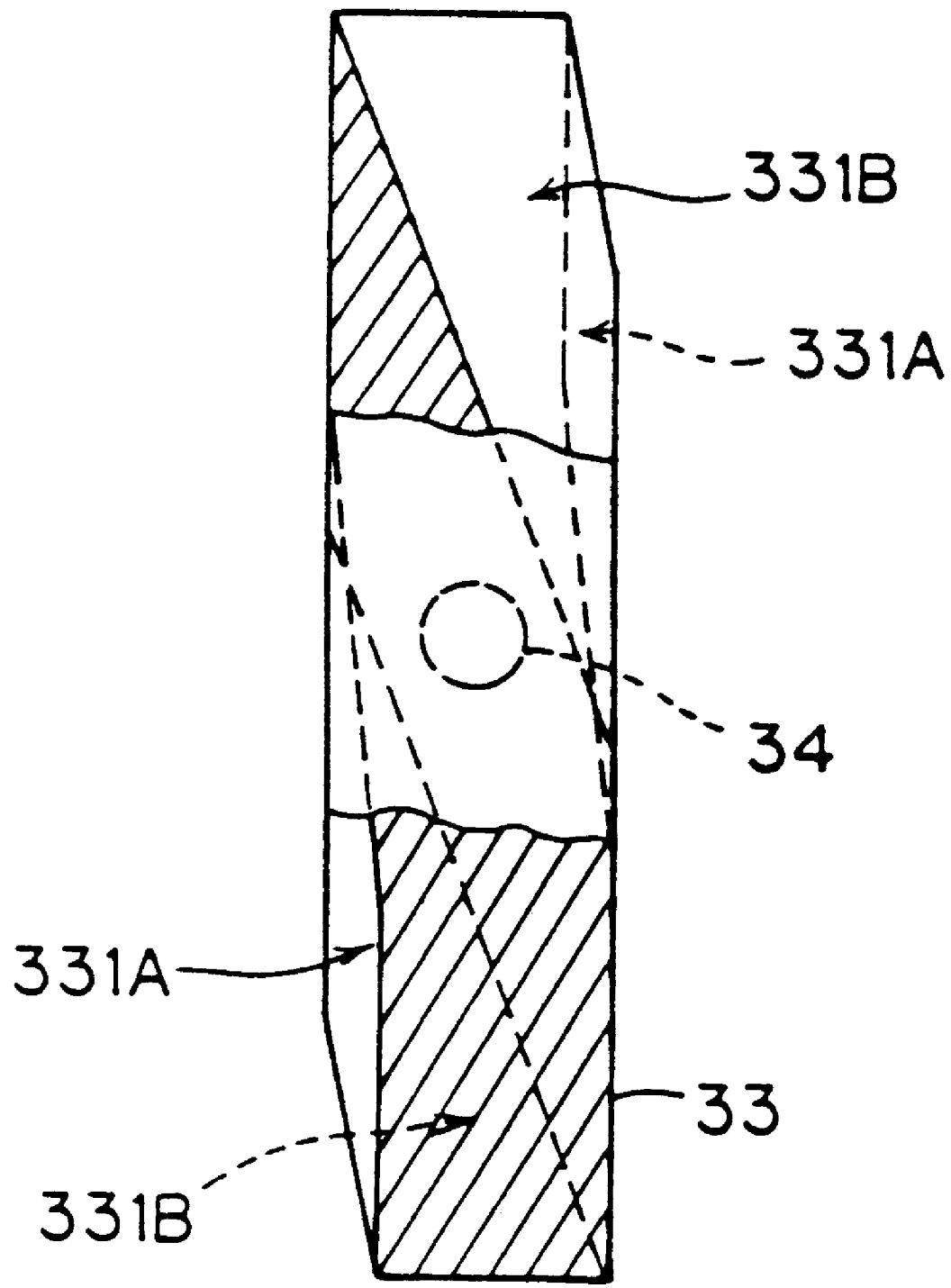
FIG. 10 shows the configuration of grooves of the retaining plates shown in FIG. 9.

FIG. 10 shows the configuration of the grooves 331A and 331B as viewed in the direction indicated by the arrow A of FIG. 9. In FIG. 10, two parts are shown in partial section for purposes of clarifying the configuration of the grooves 331A and 331B.

With reference to FIGS. 11 through 17, description will be given on the transfer of the substrates W between the substrate transport robot 3 having the retaining plates 33 of the above described configuration and the push-up portion 23.

FIGS. 11 through 15 illustrate the operation of the pair of retaining plates 33 receiving the substrates W pushed up from the cassette C by the push-up base 233, with the centerline shown as associating the substrates W as viewed from the front and the substrates W as viewed from above with each other, as in FIG. 4.

Figure 11:
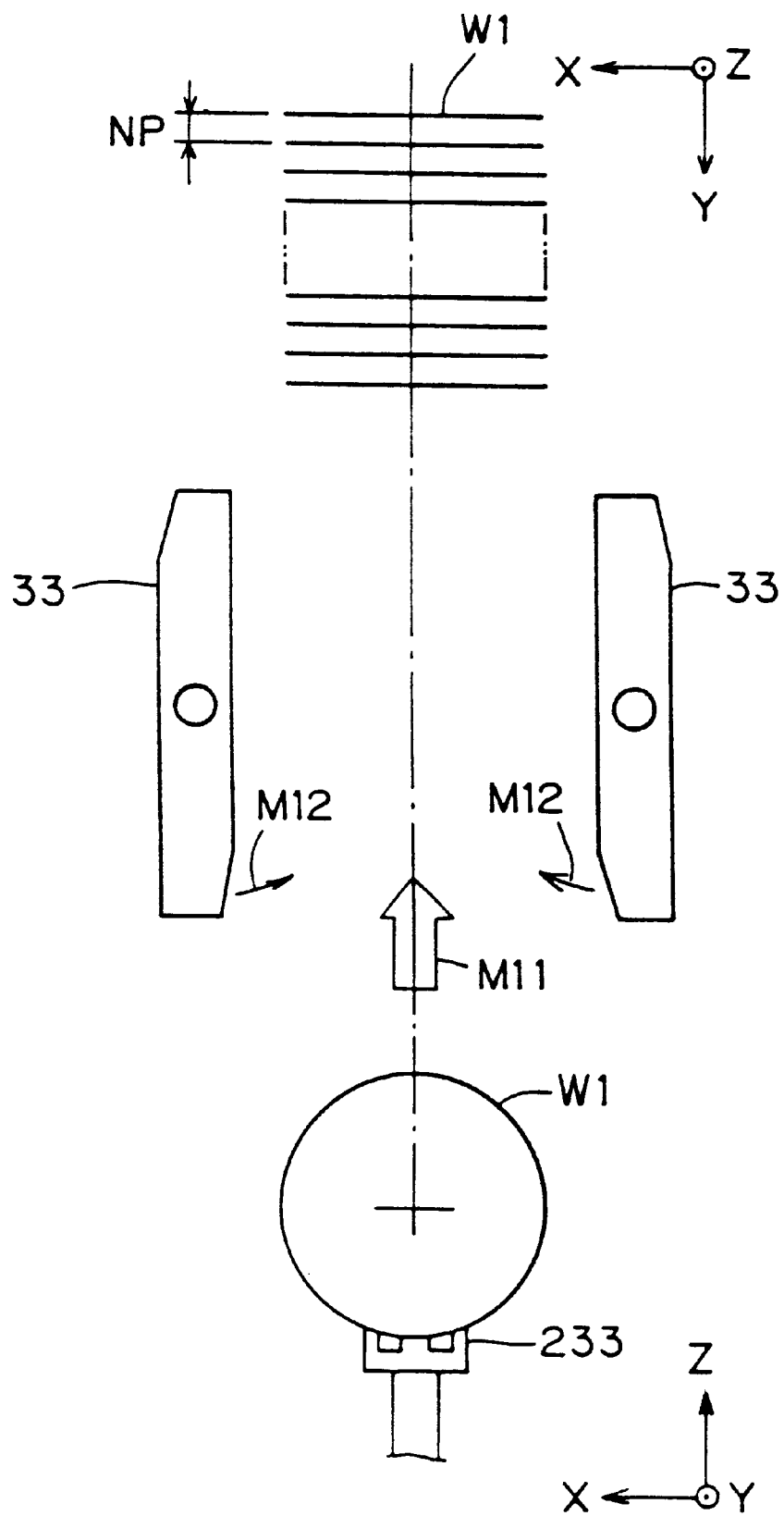
FIG. 11 shows one state of the operation of transferring the substrates by means of the push-up base of the push-up mechanism and the retaining plates of FIG. 9.

In the operation of the transfer of the substrates W, the movable base 231 of the push-up portion 23 initially moves the push-up mechanism 23a with the cassette C1 placed thereon to the position under the substrate transport robot 3. The push-up base 233 pushes upwardly the substrates W1 received at the normal pitch NP in the cassette C1 while the substrates W1 are maintained in the upright attitude, as shown in FIG. 11. After the substrates W1 are fully pushed up in the direction indicated by an arrow M11, the pair of retaining plates 33 rotate as indicated by arrows M12. Thereafter, the push-up base 233 is lowered, and thus the substrates W1 pushed up are held by the retaining plates 33, with the outer peripheries of the substrates W1 in sideways contact with the retaining plates 33 as shown in FIG. 12.

Figure 12:
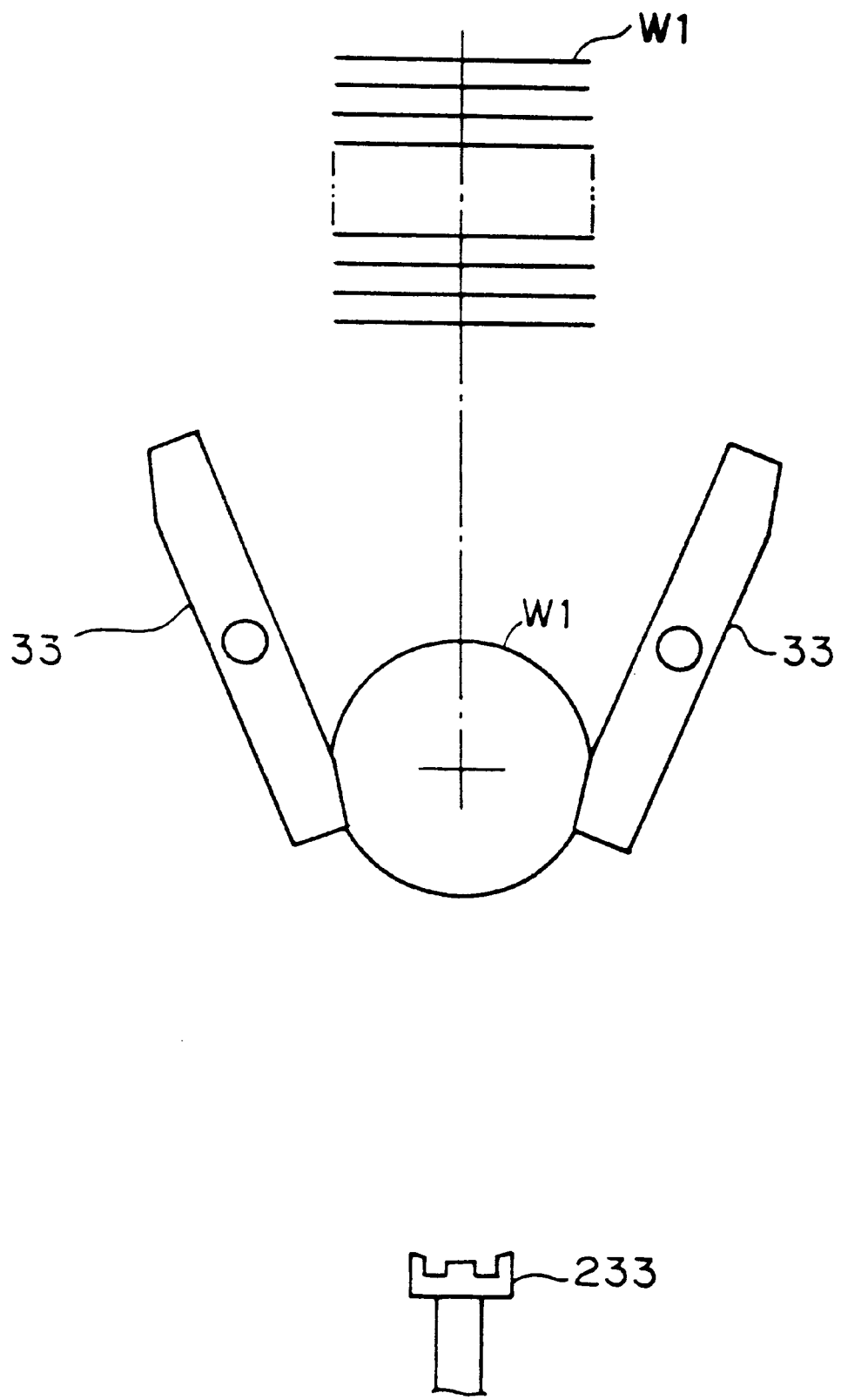
FIG. 12 shows one state of the operation of transferring the substrates by means of the push-up base of the push-up mechanism and the retaining plates of FIG. 9.
Figure 16:
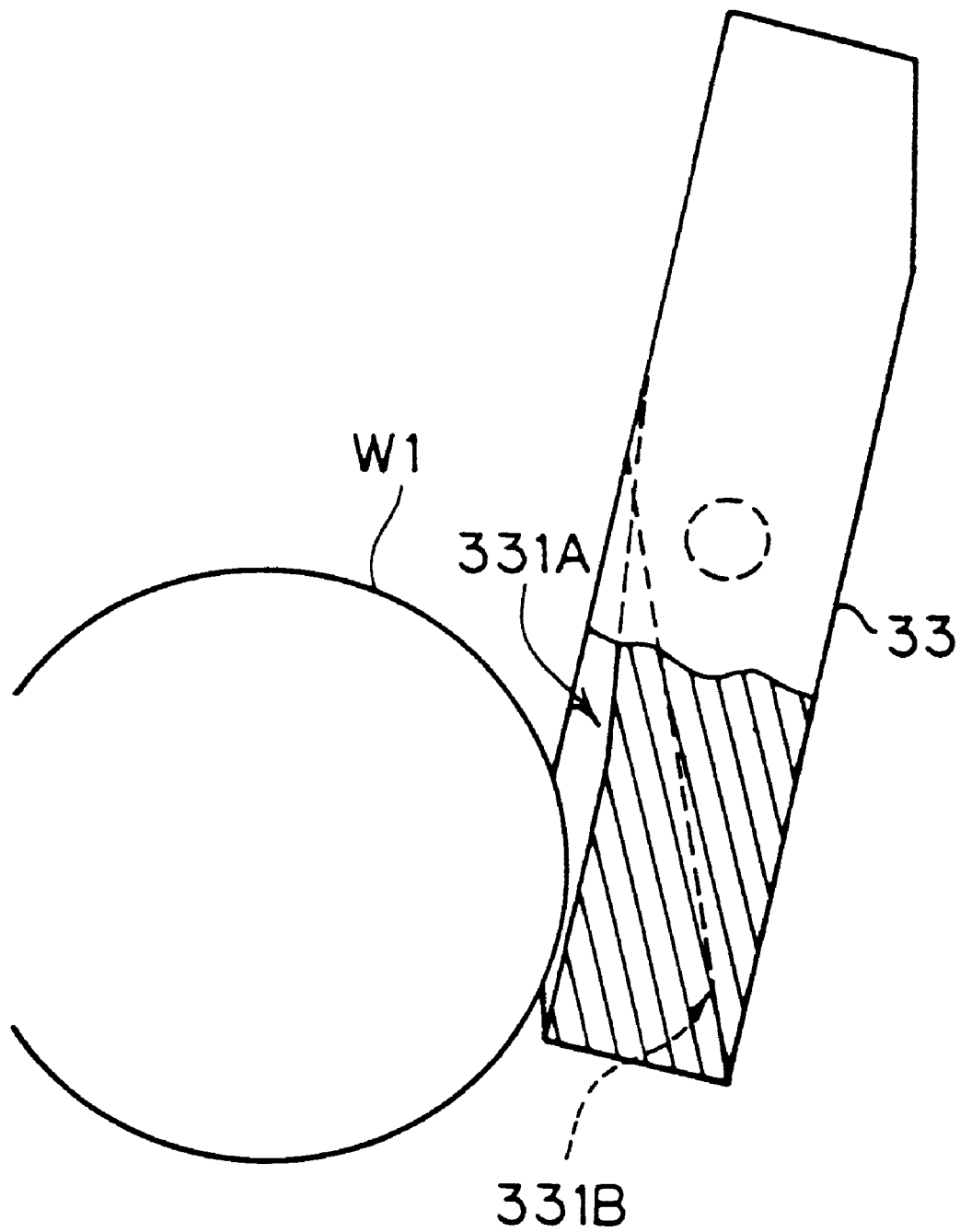
FIG. 16 shows the substrates held at a normal pitch by the retaining plates of FIG. 9.

FIG. 12 shows the substrates W1 held at the normal pitch NP. At this time, the substrates W1 are held in such a manner that the outer peripheries thereof are fitted in the shallow grooves 331A of the retaining plates 33. The positional relationship between the grooves 331A and the substrates W1 in this state is shown in FIG. 16.

When the transfer of the substrates W1 on the push-up mechanism 23a is completed, the push-up base 233 is further lowered. Next, the movable base 231 operates to move the push-up mechanism 23b with the cassette C2 placed thereon to the position under the substrate transport robot 3. At this time, the position of the substrates W2 on the push-up mechanism 23b is shifted by the half pitch HP in the Y direction from the position of the substrates W1 held by the retaining plates 33.

Figure 13:
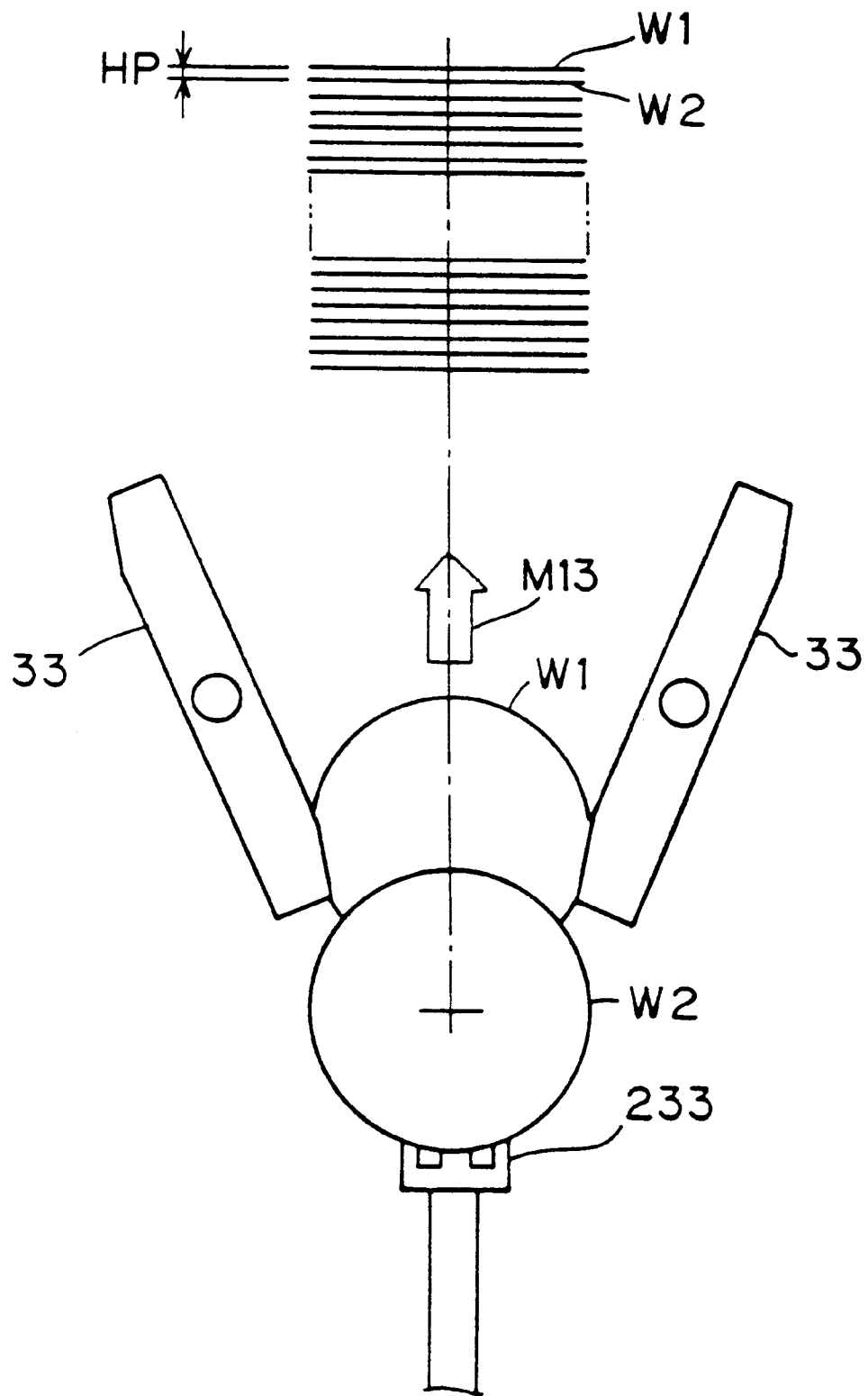
FIG. 13 shows one state of the operation of transferring the substrates by means of the push-up base of the push-up mechanism and the retaining plates of FIG. 9.

When the movement of the push-up mechanism 23b is completed, the push-up base 233 rises to push up the substrates W2, as shown in FIG. 13. The substrates W2 are pushed upwardly to enter the spaces between the plurality of substrates W1 held by the retaining plates 33 without contacting the substrates W1. The substrates W2 are at the same position in the Y direction as the deep grooves 331B of the retaining plates 33, and are pushed up through the grooves 331B without contacting the retaining plates 33 (FIG. 16).

Figure 14:
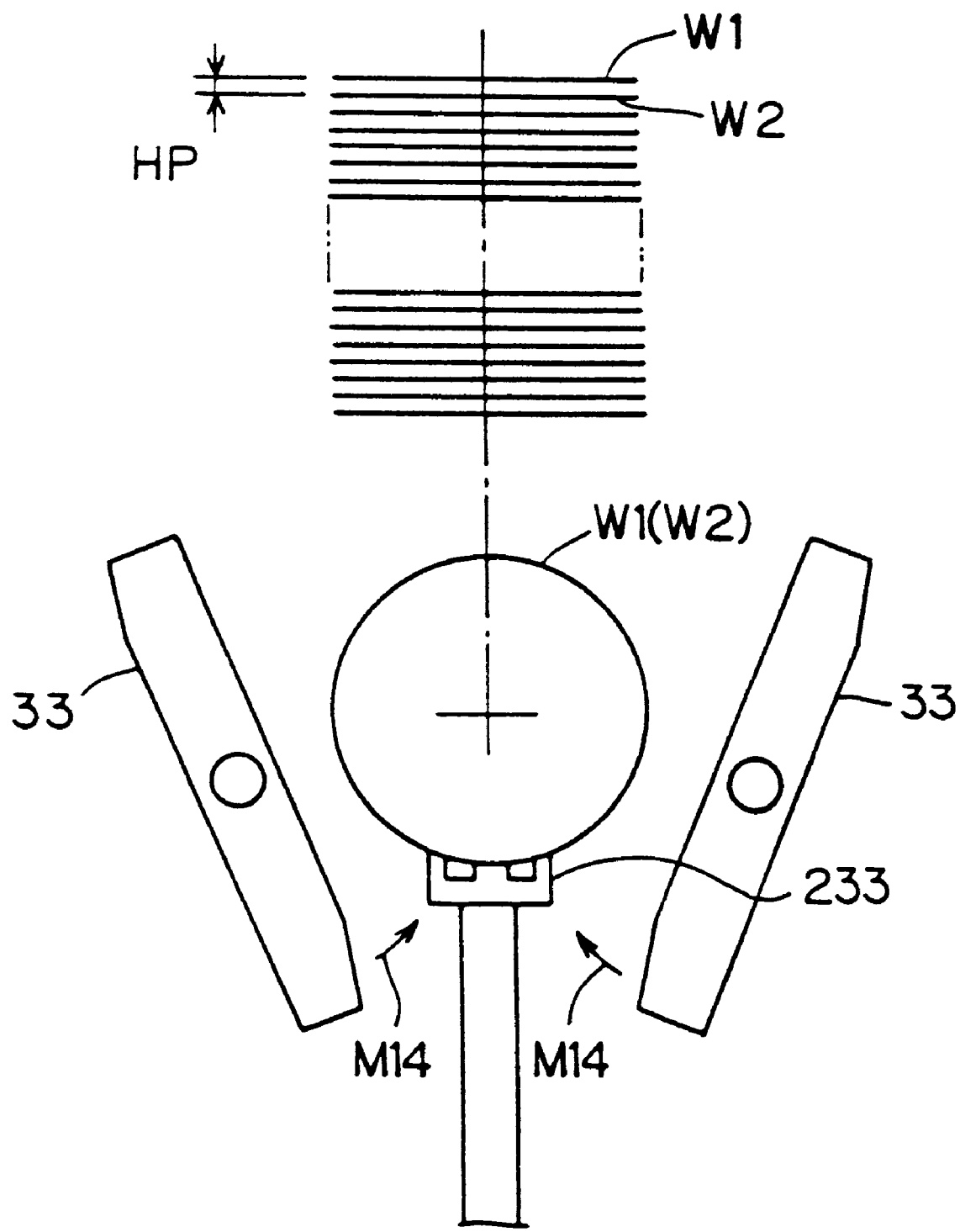
FIG. 14 shows one state of the operation of transferring the substrates by means of the push-up base of the push-up mechanism and the retaining plates of FIG. 9.

Thereafter, the push-up base 233 comes into contact with the substrates W1 held by the retaining plates 33 to push up also the substrates W1. Then, the substrates W1 and W2 are arranged in parallel at the half pitch HP on the push-up base 233, as shown in FIG. 14. The upper surface of the push-up base 233 of the push-up mechanism 23b is formed with grooves arranged at the half pitch HP in the Y direction and receiving the outer peripheries of the substrates W1 and W2 fitted therein for retention of the substrates W1 and W2 at the half pitch HP in the upright attitude.

Figure 17:
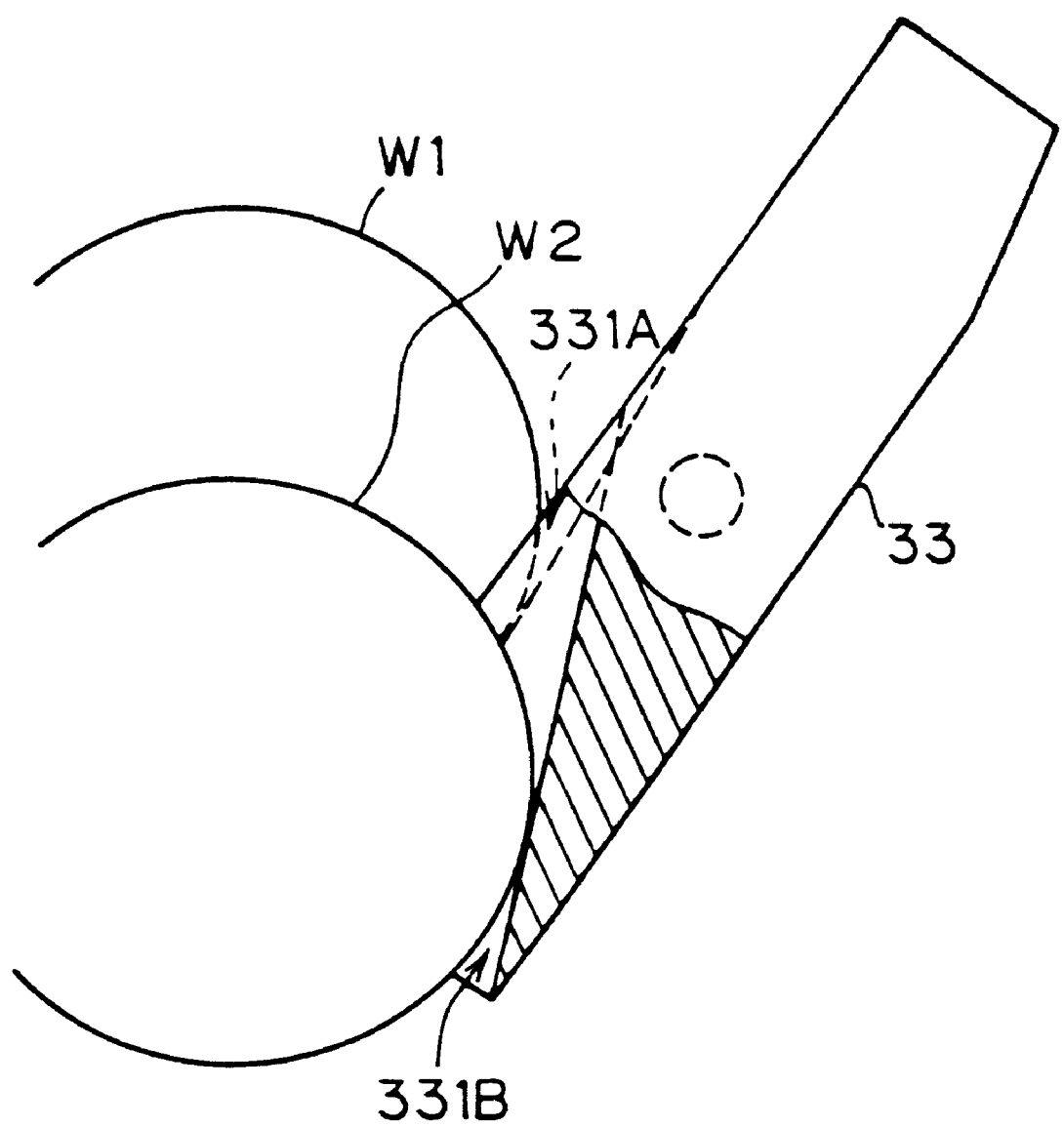
FIG. 17 shows the substrates held at a half pitch by the retaining plates of FIG. 9.

When all of the substrates W1 and W2 are pushed up by the push-up base 233, the retaining plates 33 further rotate as indicated by the arrows M14 of FIG. 14. Thereafter, the push-up base 233 is lowered, and all of the substrates W1 and W2 on the push-up base 233 are held as a group of substrates by the pair of retaining plates 33 in such a manner that the outer peripheries of the substrates W1 and W2 are fitted sideways into the grooves 331A and 331B formed in the retaining plates 33. The push-up base 233 is further lowered as indicated by the arrow M15 of FIG. 15. The positional relationship between the substrates W1 and W2 and the retaining plates 33 is shown in FIG. 17. As shown in FIG. 17, the grooves 331A and 331B which are different in configuration contact the substrates W1 and W2 at different levels, providing different vertical positions between the substrates W1 and the substrates W2.

When the transfer of the substrates W between the substrate transport robot 3 and the push-up portion 23 is completed, the substrates W in a state shown in FIG. 17 are transported to the pre-cleaning portion 4a, the post-cleaning portions 4b, and the drying portion 4c.

In the operation of the transfer of the substrates W between the substrate transport robot 3 and the pre-cleaning portion 4a and the like, the substrate transport robot 3 is initially positioned over the pre-cleaning portion 4a and the like while holding the substrates W. Subsequently, the elevating base 42a moves upwardly until it comes into contact with and holds all of the substrates W held by the retaining plates 33. The retaining plates 33 are rotated until the retaining plates 33 are parallel to the Z direction. The elevating base 42a is then lowered into the bath 41 while holding the substrates W, to dip the substrates W in the cleaning liquid. The above operation is reversed when the substrate transport robot 3 receives the substrates W from the pre-cleaning portion 4a and the like. The substrate transport robot 3 is adapted to property use the opposite surfaces of the retaining plates 33 depending on the surface states of the substrates W to hold the substrates W.

The substrate transport robot 3 transport s the substrates W which have been subjected to the cleaning processing to the position over the push-up portion 23. The substrate transport robot 3 performs operations in reversed relation with the operations thereof performed when the substrate transport robot 3 receives the substrates W1 and W2 from the push-up portion 23, to insert the substrates W3 and W2 held at the half pitch HP by the substrate transport robot 3 into the two cassettes C1 and C2 on the push-up portion 23 so that the substrates W1 and W2 are arranged at the normal pitch NP.

Figure 18A:
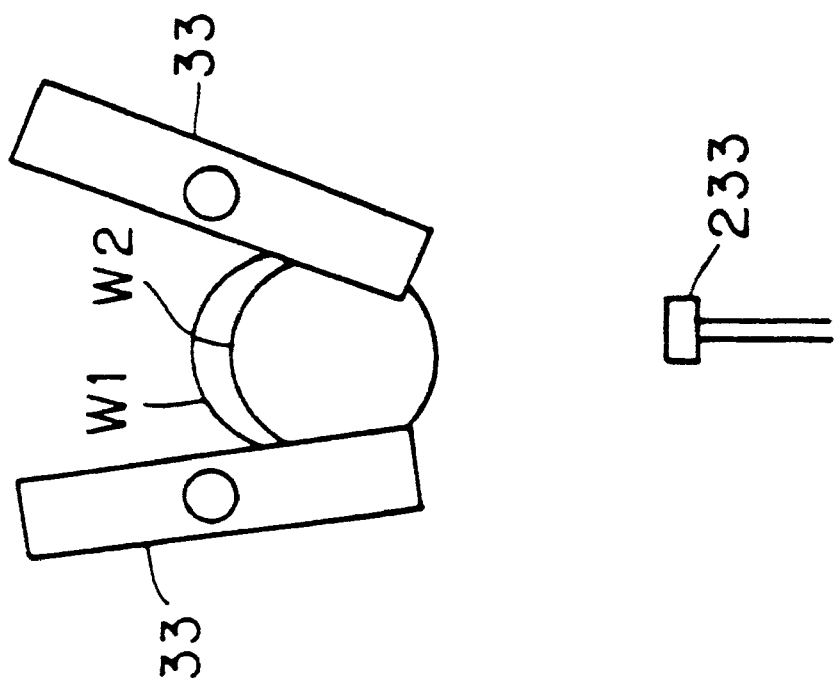
FIG. 18(a) shows the substrates held at the normal pitch by the retaining plates.
Figure 18B:
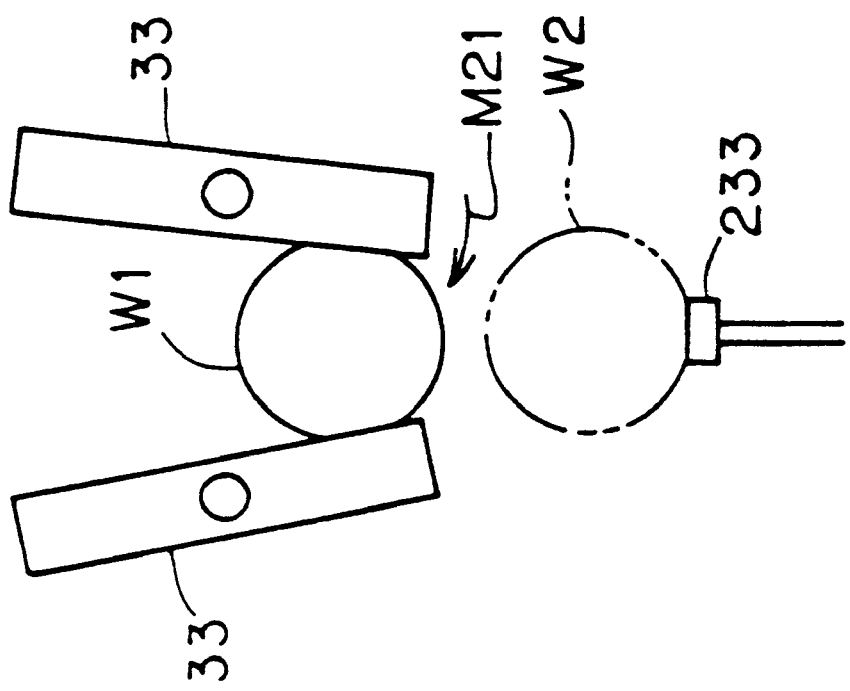
FIG. 18(b) shows the substrates held at the half pitch by the retaining plates.

In the above-mentioned embodiment, if it is not necessary to use the opposite surfaces of the retaining plates 33, one of the retaining plates 33 may be rotated on the associated shaft 34 to achieve the above described retaining operation, as shown in FIG. 18. FIG. 18(a) shows the substrates W1 held at the normal pitch NP by the retaining plates 33. FIG. 18(b) shows the substrates W1 and W2 held at the half pitch HP by rotating only one of the retaining plates 33 as indicated by an arrow M21. This allows the transfer of the substrates W by using a more simplified structure.

As described hereinabove, the substrate processing apparatus employs the pushup portion 23 and the retaining plates 33 of the substrate transport robot 3 to render the arrangement of the substrates W changeable between the normal pitch and the half pitch within the substrate processing apparatus. This eliminates the need to provide the pitch changing apparatus outside the substrate processing apparatus and to couple the pitch changing apparatus to the substrate processing apparatus as in the first embodiment. Therefore, the deposition of particles on the substrates and the damages to the substrates are reduced. Furthermore, the problem of the increased size of the apparatus due to the coupling of the pitch changing apparatus to the substrate processing apparatus is eliminated. Additionally, this embodiment wherein the two retaining plates 33 hold the substrates W simplifies the construction and facilitates the manufacture and assembly of the substrate processing apparatus.

<3. Third Embodiment>

Figure 19:
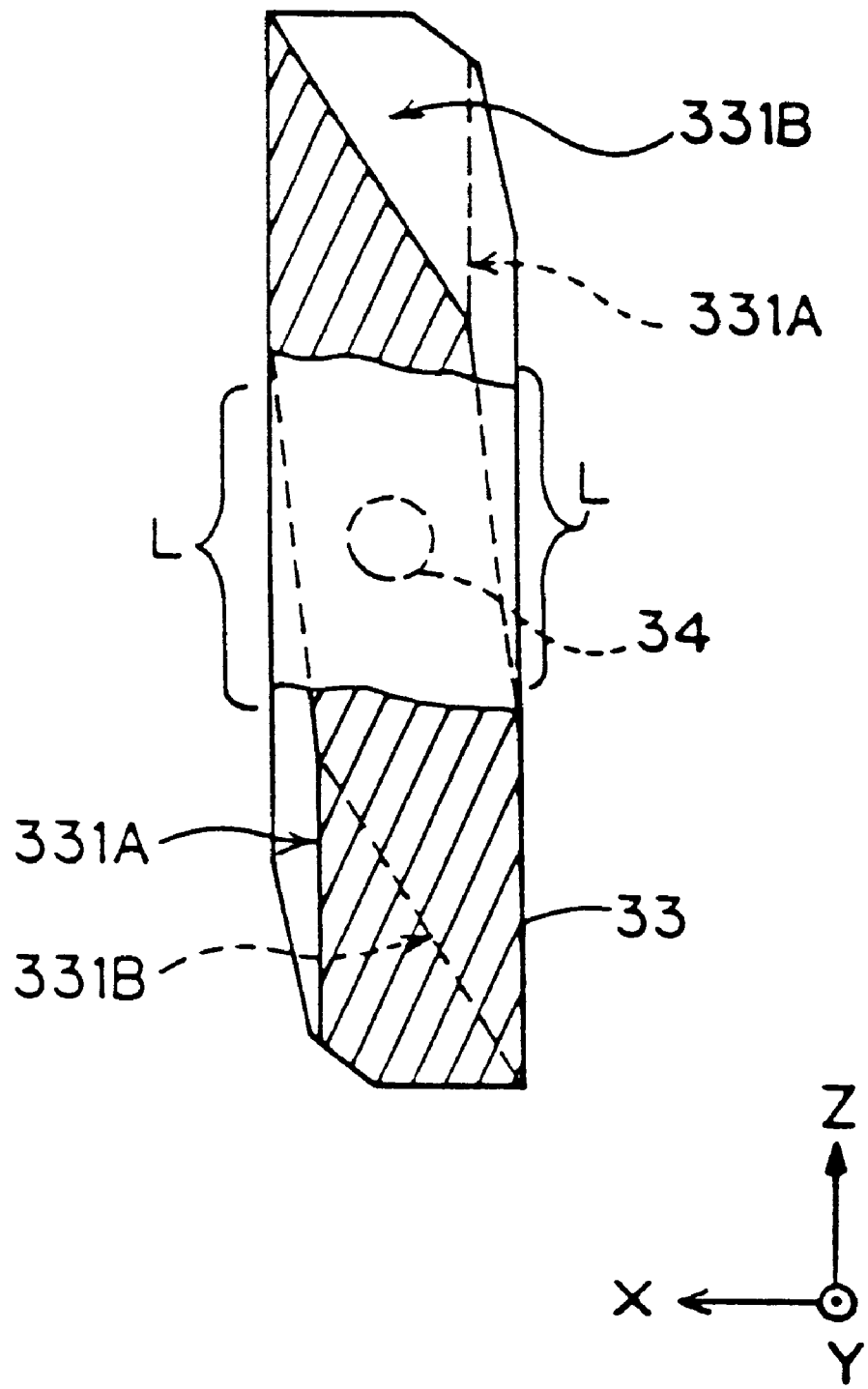
FIG. 19 shows the configuration of grooves of the retaining plates of the substrate processing apparatus according to a third embodiment of the present invention.

FIG. 19 shows another embodiment of the retaining plates 33 of the substrate transport robot 3 in the substrate processing apparatus of the third embodiment. As in FIG. 10, the grooves 331A and the grooves 331B which are different in depth are shown in FIG. 19 in partial section. Other parts are similar in construction and operation to those of the second embodiment.

As shown in FIG. 19, the opposite surfaces of the retaining plates 33 have the grooves 331A and 331B similar to those of the second embodiment which are arranged alternately at the half pitch HP in the Y direction. These grooves differ in configuration from those of the second embodiment.

Figure 20:
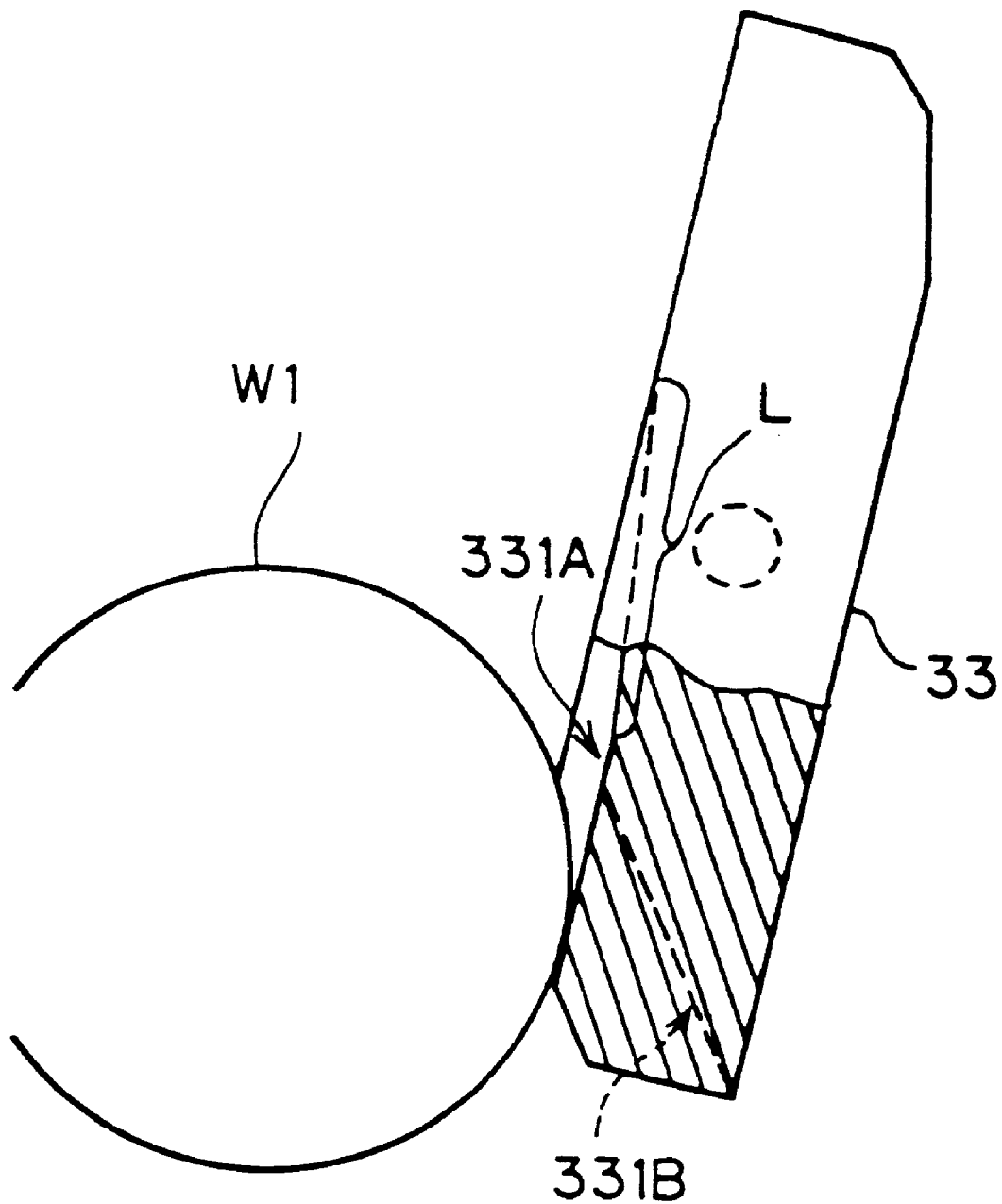
FIG. 20 shows the substrates held at the normal pitch by the retaining plates of FIG. 19.

More specifically, the grooves 331A and the grooves 331B of the retaining plates 33 shown in FIG. 19 are different in configuration from each other in a position farther from the shaft 34 serving as the center of rotation, but are similar in configuration to each other in a position closer to the shaft 34 (as indicated by the reference character L in FIG. 19). Thus, in the state corresponding to FIG. 16 during the substrate transfer operation of the second embodiment, the substrates W1 are held in the grooves 331A as shown in FIG. 20, and the grooves 331B permit the substrates W2 to vertically pass through. On the other hand, in the state shown in FIG. 21 corresponding to FIG. 17 of the second embodiment, the substrates W1 and the substrates W2 are held respectively in the grooves 331A and 331B at a generally similar vertical position (level).

Figure 21:
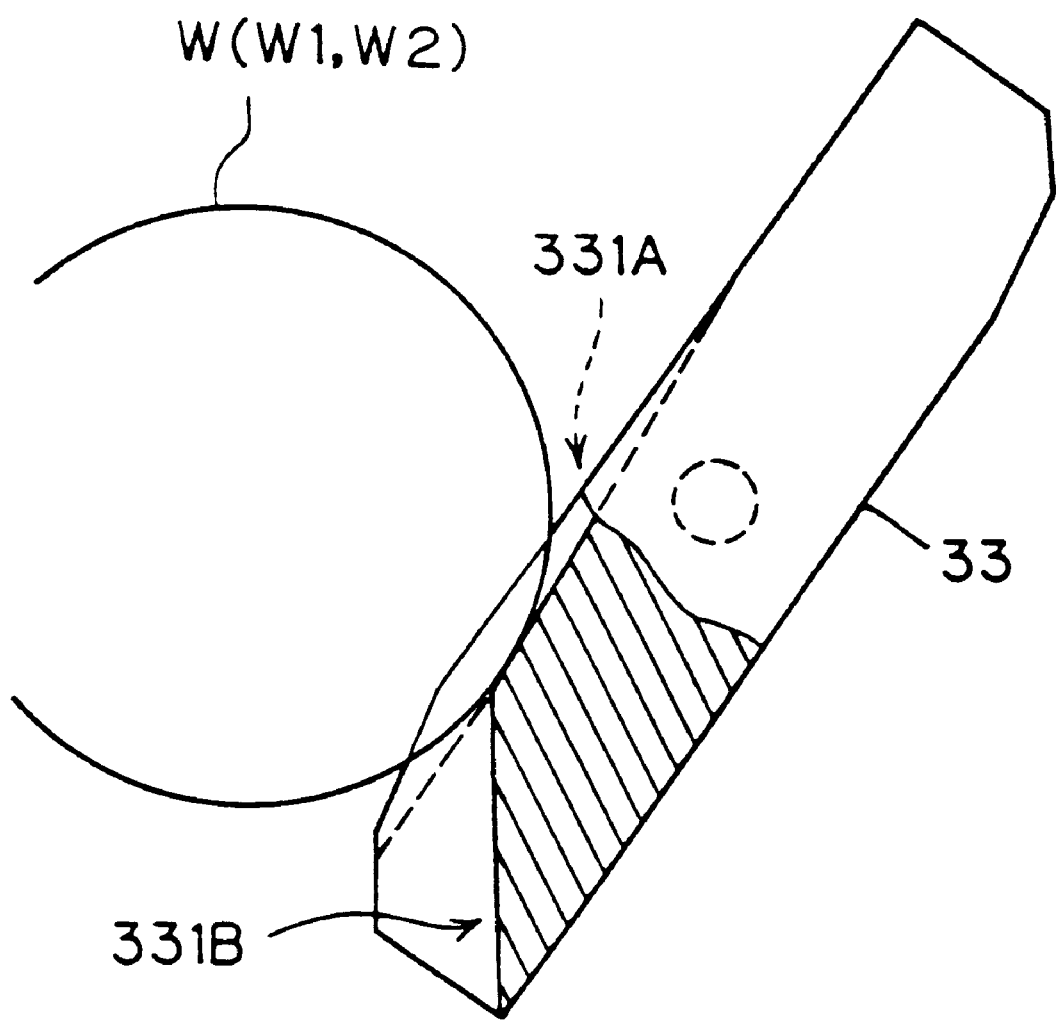
FIG. 21 shows the substrates held at the half pitch by the retaining plates of FIG. 19.

In this manner, the grooves are formed so that the position at which the substrates W1 are held in the grooves 331A of the retaining plates 33 and the position at which the substrates W2 are held in the grooves 331B thereof are similar as viewed in the Z direction. Thus, in the operation of the transfer of the substrates W from the substrate transport robot 3 to the push-up base 233 or the elevating base 42a in the state shown in FIG. 21, the retaining plates 33 may be rotated immediately after the push-up base 233 or the elevating base 42a rises into generally simultaneous contact with all of the substrates W. As a result, the operation of the transfer of the substrates W may be performed quickly. The same is true for the reversed operation, that is, the transfer of the substrates W from the push-up base 233 or the elevating base 42a to the substrate transport robot 3. Additionally, as shown in FIG. 21, the decrease in the depth to which the substrates W are fitted in the grooves, with the substrates W1 and W2 held at the half pitch by the retaining plates 33, may reduce the degree to which the substrates W rub against the grooves, thereby further suppressing the generation of particles and the damages to the substrates W.

<4. Fourth Embodiment>

Figure 22:
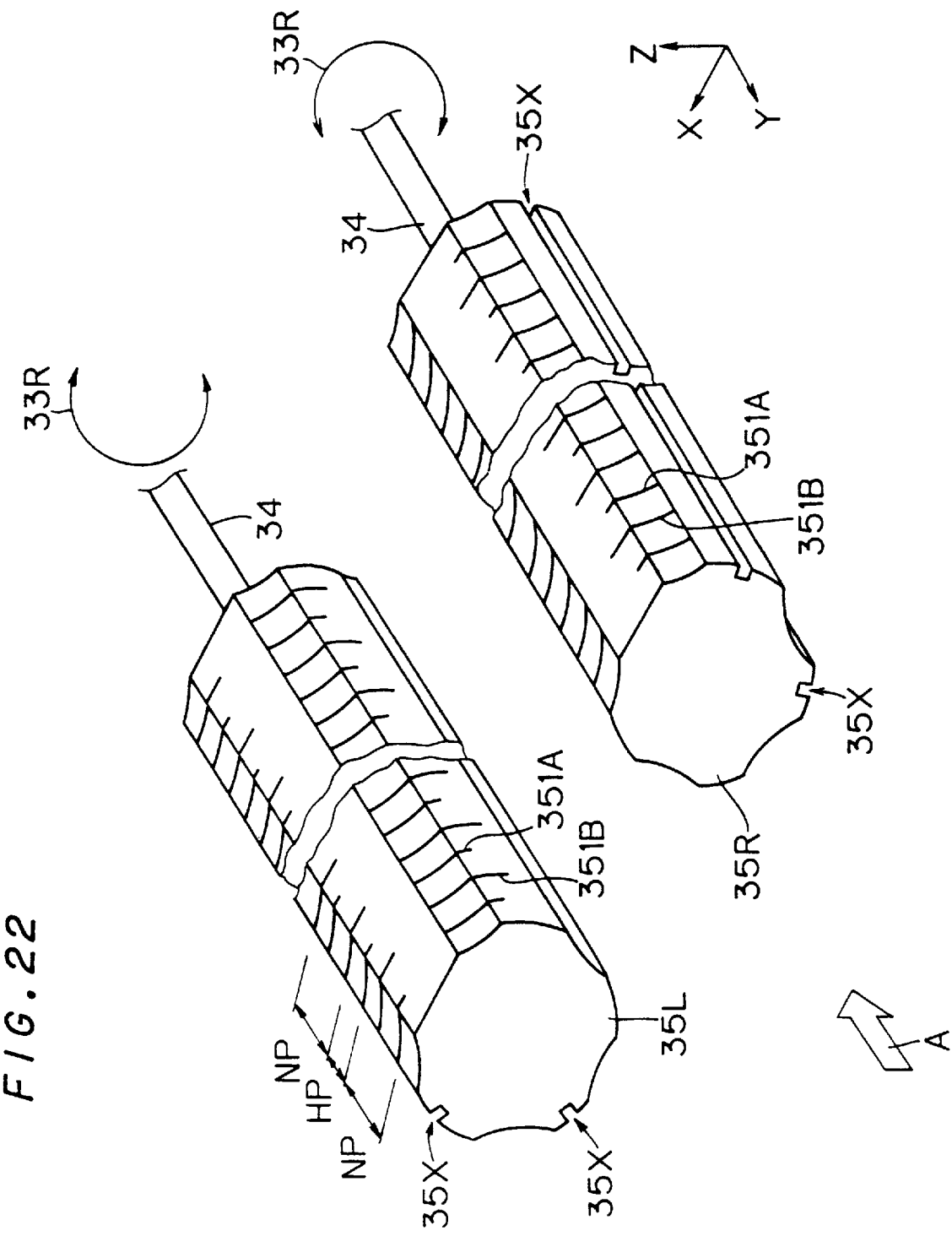
FIG. 22 is a perspective view of retaining columns of the substrate processing apparatus according to a fourth embodiment of the present invention.

FIG. 22 is a perspective view of parts of the substrate transport robot 3 which hold the substrates W in the substrate processing apparatus according to a fourth embodiment of the present invention. Other parts are similar in construction to those of the substrate processing apparatus 1 of the first embodiment, and are described by using like reference characters.

The substrate transport robot 3 of the fourth embodiment is similar in construction to the substrate transport robot 3 of the second embodiment. Specifically, although the substrate transport robot 3 of the second embodiment includes the retaining plates 33, the substrate transport robot 3 of the fourth embodiment includes a pair of retaining columns 35R and 35L each made of a columnar member elongated in the Y direction as shown in FIG. 22. These retaining columns hold the outer peripheries of the substrates W to retain the substrates W in the upright attitude. Each of the retaining columns 35R and 35L is connected through a shaft 34 extending in the Y direction to the main body portion 3a of the substrate transport robot 3 which serves as a retention driving mechanism. The main body portion 3a allows the retaining columns 35R and 35L to rotate on the respective shafts 34 as indicated by arrows 33R.

The retaining columns 35R and 35L are formed with grooves for holding the substrates W in the upright attitude. Specifically, shallow grooves 351A and deep grooves 351B are alternately arranged in the Y direction in parts of the retaining columns 35R and 35L, with the spacings therebetween defined at the half pitch HP. In other words, the grooves 351A themselves are arranged at the normal pitch NP in the Y direction, and the grooves 351B are arranged at the normal pitch NP in the Y direction in positions intermediate between the grooves 351A.

Figure 23:
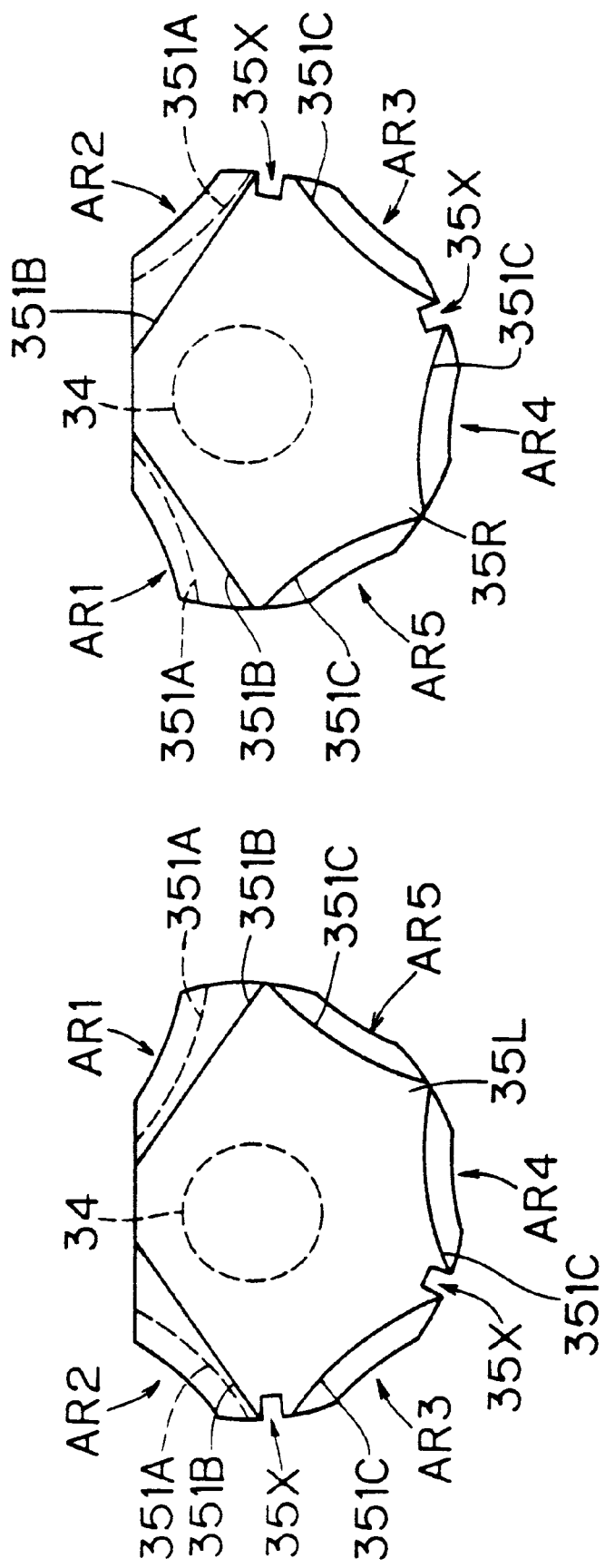
FIG. 23 shows the configuration of the retaining columns of FIG. 22.

FIG. 23 shows the configuration of the retaining columns 35R and 35L as viewed in the direction of the arrow A of FIG. 22. It should be noted that FIG. 23 shows a cross-section of the retaining columns 35R and 35L taken along the plane XZ at the position of a deep groove 351B.

As illustrated in FIGS. 22 and 23, the two retaining columns 35R and 35L are mirror images of each other in configuration. The side surfaces of each of the retaining columns 35R and 35L are divided into five areas AR1, AR2, AR3, AR4 and AR5 in a circumferential direction about the axis (axis extending in the Y direction) of each retaining column 35R and 35L. The shallow grooves 351A and the deep grooves 351B are formed in the above described manner in the areas AR1 and AR2 among the five areas of the retaining columns 35R and 35L. On the other hand, grooves 351C of the same depth are formed at the half pitch HP in the areas AR3, AR4 and AR5. In the fourth embodiment, these five areas are used for respective determined purposes which will be described later.

With reference to FIGS. 24 through 28, description will be given on the transfer of the substrates W between the substrate transport robot 3 having the retaining columns 35R and 35L of the above described configuration and the push-up portion 23, and the embodiment in which the retaining columns 35R and 35L hold the substrates W.

FIGS. 24 through 28 illustrate the substrates W held by the pair of retaining columns 35R and 35L, with the centerline shown as associating the substrates W as viewed from the front and the substrates W as viewed from above with each other, as in FIG. 4.

Figure 24:
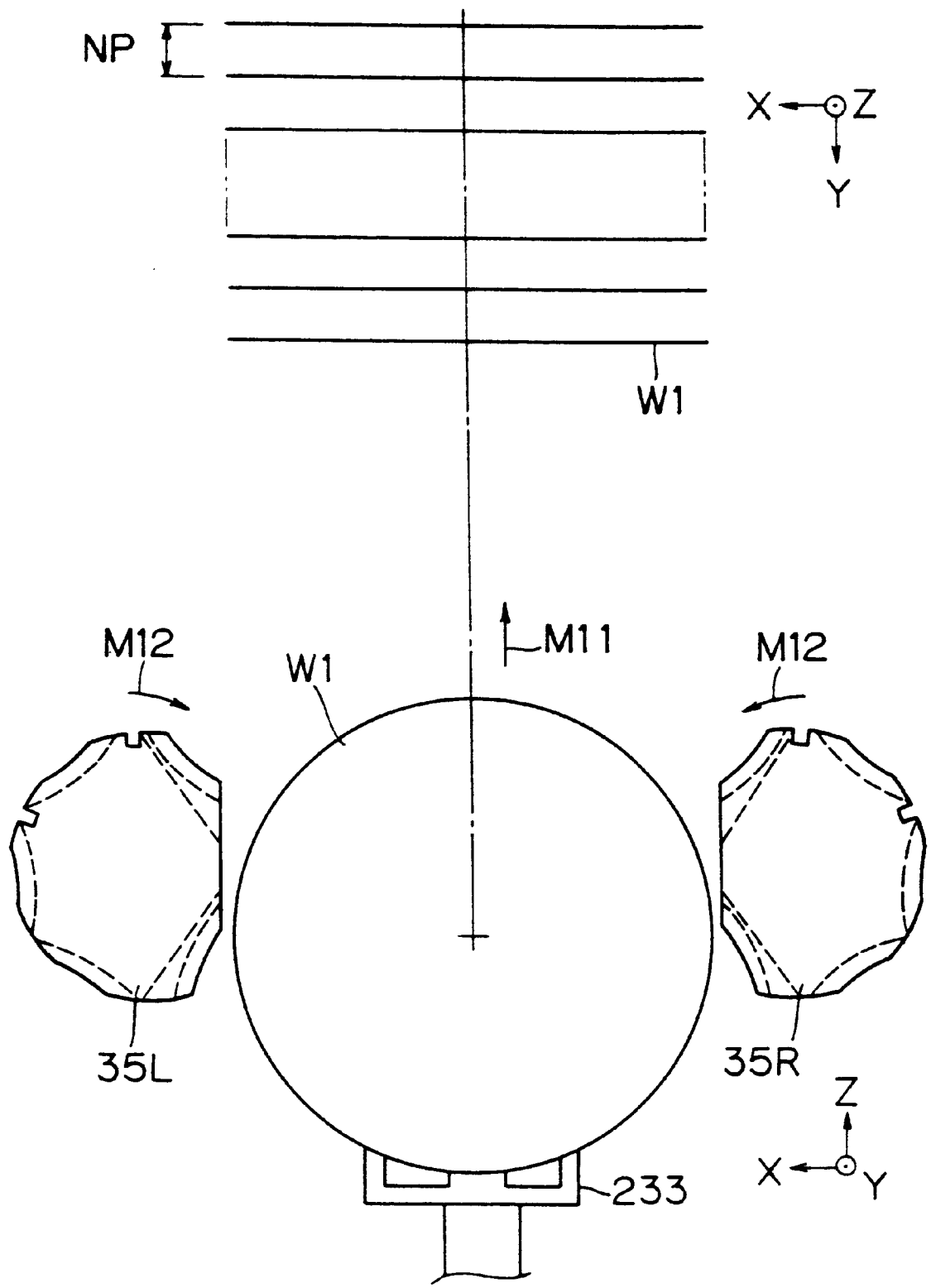
FIG. 24 shows the substrates held by the pair of retaining columns of FIG. 22.
Figure 25:
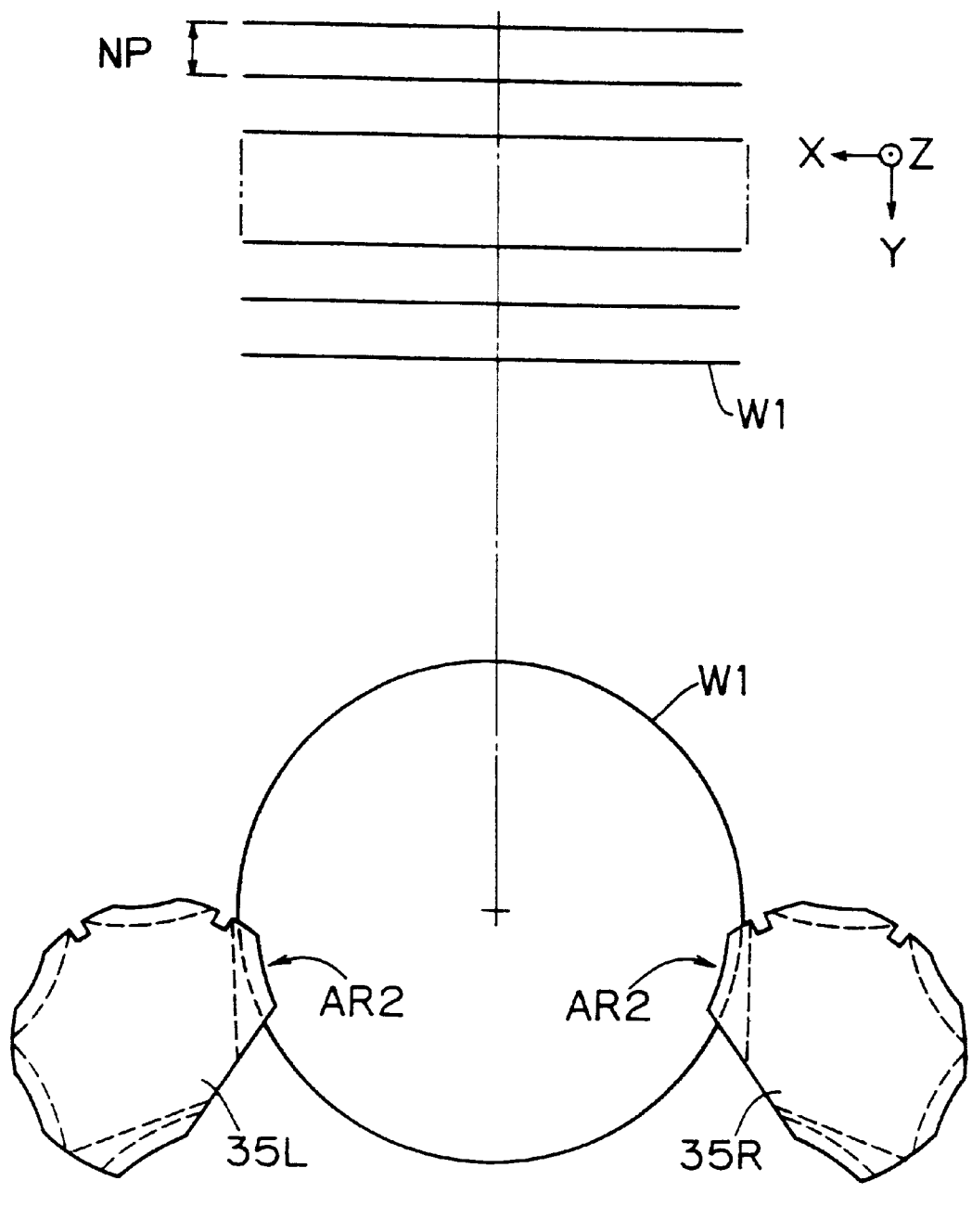
FIG. 25 shows the substrates held by the pair of retaining columns of FIG. 22.

The operation of transfer of the substrates W is similar to the operation of the transfer of the substrates W in the second embodiment. First, the movable base 231 of the push-up portion 23 moves the push-up mechanism 23a with the cassette C1 placed thereon to the position under the substrate transport robot 3, and the push-up base 233 pushes upwardly the substrates W1 received at the normal pitch NP in the cassette C1 while the substrates W1 are maintained in the upright attitude, as shown in FIG. 24. After the substrates W1 are fully pushed up in the direction indicated by the arrow M11, the pair of retaining columns 35R and 35L are rotated as indicated by the arrows M12. Thereafter, the push-up base 233 is lowered, and thus the substrates W1 pushed up are held at the normal pitch NP, with the outer peripheries of the substrates W1 in sideways contact with the retaining columns 35R and 35L, as shown in FIG. 25. At this time, the area AR2 among the five areas of the retaining columns 35R and 35L is used as a substrate receiving area for holding the substrates W1. The substrates W1 are held in such a manner that the outer peripheries of the substrates W1 are fitted in the shallow grooves 351A in the substrate receiving area AR2.

When the transfer of the substrates W1 on the push-up mechanism 23a is completed, the push-up base 233 is further lowered. Next, the movable base 231 is moved to move the push-up mechanism 23b with the cassette C2 placed thereon to the position under the substrate transport robot 3. At this time, the position of the substrates W2 on the push-up mechanism 23b is shifted by the half pitch HP in the Y direction from the position of the substrates W1 held by the retaining columns 35R and 35L.

When the movement of the push-up mechanism 23b is completed, the push-up base 233 rises to push up the substrates W2. The substrates W2 are pushed upwardly to enter the spaces between the substrates W1 held by the retaining columns 35R and 35L without contacting the substrates W1. The substrates W2 are at the same position in the Y direction as the deep grooves 351B in the substrate receiving area AR2 of the retaining columns 35R and 35L, and are pushed up through the deep grooves 351B without contacting the retaining columns 35R and 35L.

Thereafter, the push-up base 233 comes into contact with the substrates W1 held in the shallow grooves 351A in the substrate receiving area AR2 to push up also the substrates W1. Then, the substrates W1 and W2 are arranged in parallel at the half pitch HP on the push-up base 233 (in the state similar to the state shown in FIG. 14). The upper surface of the push-up base 233 of the push-up mechanism 23b is formed with grooves arranged at the half pitch HP in the Y direction and receiving the outer peripheries of the substrates W1 and W2 fitted therein for retention of the substrates W1 and W2 in the upright attitude at the half pitch HP.

Figure 26:
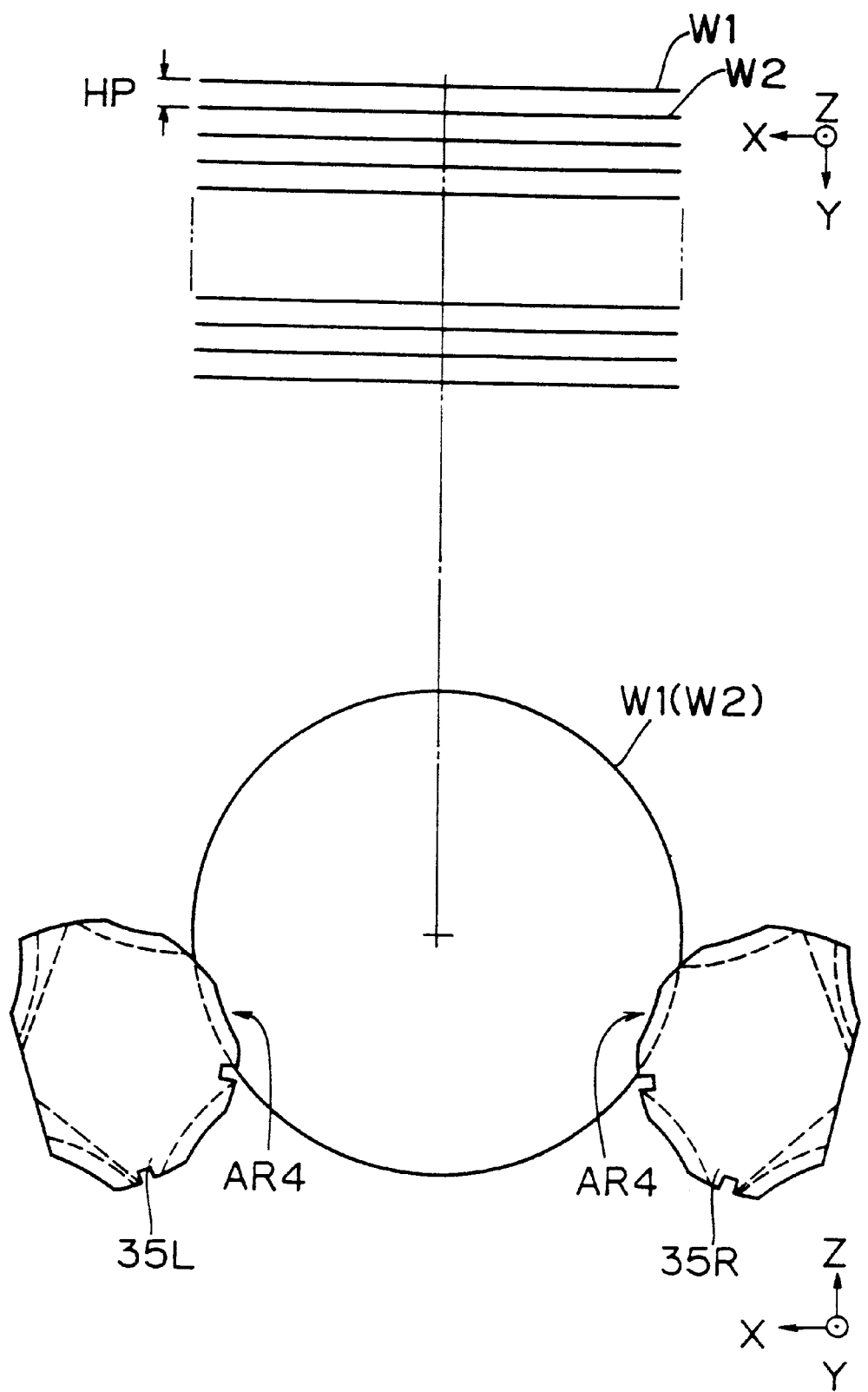
FIG. 26 shows the substrates held by the pair of retaining columns of FIG. 22.

When all of the substrates W1 and W2 are pushed up by the push-up base 233, the retaining columns 35R and 35L further rotate. Thereafter, the push-up base 233 is lowered, and all of the substrates W1 and W2 on the push-up base 233 are held as a group of substrates arranged at the half pitch HP in such a manner that the outer peripheries of the substrates W1 and W2 are in sideways contact with the retaining columns 35R and 35L (FIG. 26). At this time, as illustrate in FIG. 26, the area AR4 of the retaining columns 35R and 35L is used as an unprocessed substrate retaining area for holding the substrates which have not yet been processed. The substrates W1 and W2 constituting the substrate group are held at the half pitch HP in such a manner that the outer peripheries of the substrates W1 and W2 are fitted in the grooves 351C in the unprocessed substrate retaining area AR4. Thereafter, the push-up base 233 is further lowered.

When the transfer of the substrates W between the substrate transport robot 3 and the push-up portion 23 is completed, the substrates W in the state shown in FIG. 26 are transported to the pre-cleaning portion 4a. In the fourth embodiment, the substrates W1 and W2 are all at the same level since the substrates W1 and W2 constituting the substrate group are all held in the grooves 351C having the same depth in the unprocessed substrate retaining area AR4. As a result, also after the start of the transport by the substrate transport robot 3, adjacent substrates are prevented from contacting each other due to vibrations during the transport, and the substrates W are not damaged.

In the operation of the transfer of the substrates W between the substrate transport robot 3 and the pre-cleaning portion 4a, the substrate transport robot 3 is initially positioned over the pre-cleaning portion 4a and the like while holding the substrates W. Subsequently, the elevating base 42a moves upwardly until it comes into contact with and holds all of the substrates W held by the retaining columns 35R and 35L. After the retaining columns 35R and 35L of the substrate transport robot 3 are rotated to enter the same state as shown in FIG. 24, the elevating base 42a is lowered into the bath 41 while holding the substrates W, to dip the substrates W in the cleaning liquid.

Figure 27:
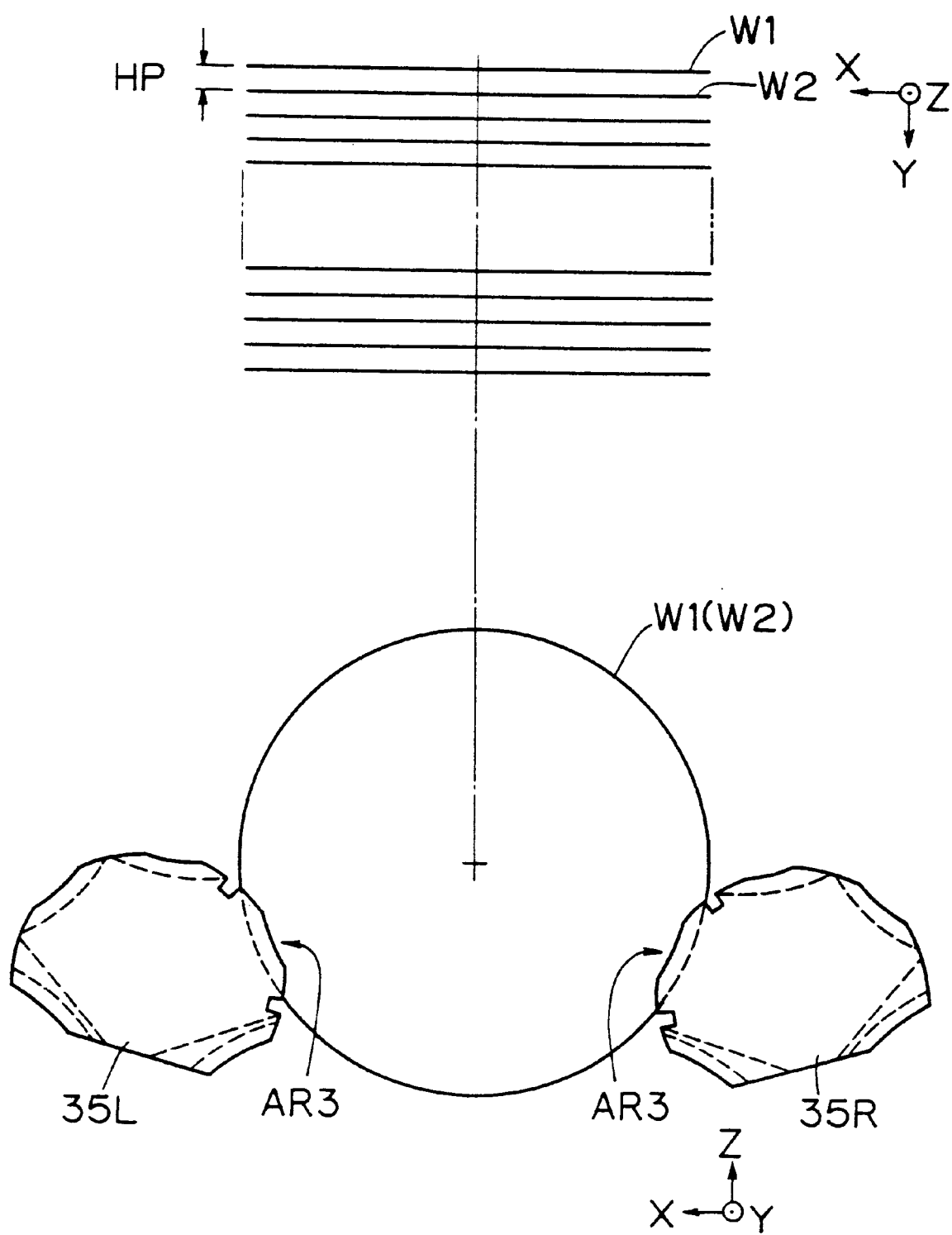
FIG. 27 shows the substrates held by the pair of retaining columns of FIG. 22.

After the cleaning processing in the pre-cleaning portion 4a is completed, the substrate transport robot 3 receives the substrates W from the pre-cleaning portion 4a. At this time, the retaining columns 35R and 35L are first placed in the same state as shown in FIG. 24, and the elevating base 42a holding the cleaned substrates W is fully elevated. Then, the retaining columns 35R and 35L are rotated and the elevating base 42a is lowered, whereby the substrates W, with the outer peripheries thereof in sideways contact with the retaining columns 35R and 35L, are held again as the substrate group having the half pitch HP (FIG. 27). In this case, as illustrated in FIG. 27, the area AR3 of the retaining columns 35R and 35L is used as an in-processing substrate retaining area for holding the substrates W which is being cleaned, that is, the substrates W with the cleaning fluid deposited thereon. The substrates W constituting the substrate group are held at the half pitch HP in such a manner that the outer peripheries of the substrates W are fitted in the grooves 351C in the in-processing substrate retaining area AR3.

Subsequently, the substrates W in the state shown in FIG. 27 are transported to one of the post-cleaning portions 4b. The procedure of the transfer of the substrates W between the substrate transport robot 3 and the post-cleaning portion 4b is similar to that of the transfer of the substrates W between the substrate transport robot 3 and the pre-cleaning portion 4a. Since the cleaning liquid is deposited on the substrates W received from the post-cleaning portion 4b, these substrates W are held by the in-processing substrate retaining area AR3 of the retaining columns 35R and 35L (FIG. 27).

Figure 28:
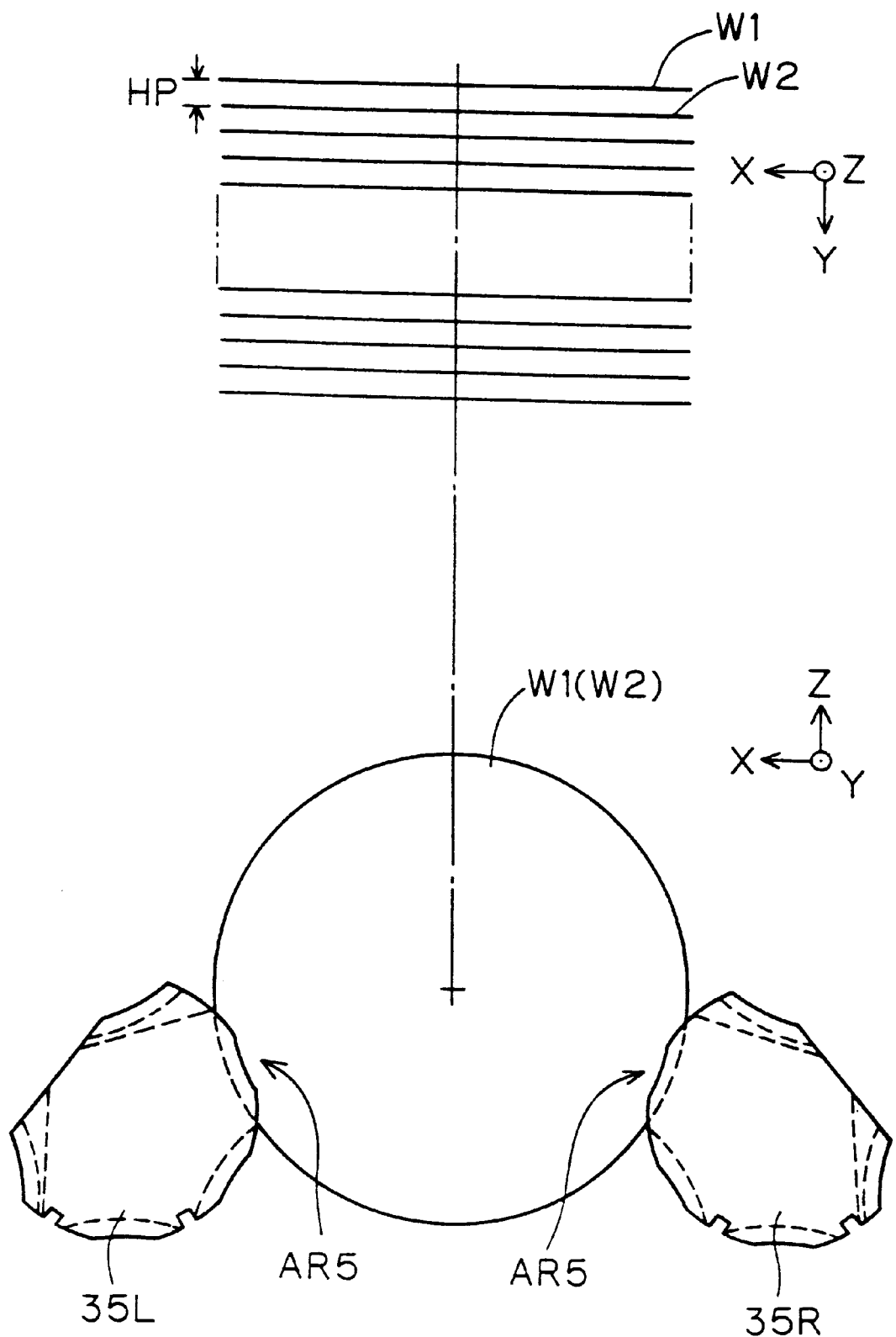
FIG. 28 shows the substrates held by the pair of retaining columns of FIG. 22.

Upon completion of the cleaning processing, the substrates W are transported in the state shown in FIG. 27 to the drying portion 4c. The procedure of the transfer of the substrates W between the substrate transport robot 3 and the drying portion 4c is also similar to that described above. However, as shown in FIG. 28, the substrates W that the substrate transport robot 3 receives from the drying portion 4c are held by the area AR5 of the retaining columns 35R and 35L. The area AR5 is used as a processed substrate retaining area for holding the substrates W which have been subjected to the cleaning processing and the drying processing. The substrates W constituting the substrate group are held at the half pitch HP in such a manner that the outer peripheries of the substrates W are fitted in the grooves 351C in the processed substrate retaining area AR5.

Subsequently, the substrates W, upon completion of the processing, are transported in the state shown in FIG. 28 to the position over the push-up portion 23 by the substrate transport robot 3. The substrate transport robot 3 performs operations in reversed relation with the operations thereof performed when the substrate transport robot 3 receives the substrates W1 and W2 from the push-up portion 23, to insert the substrates W1 and W2 held at the half pitch HP by the substrate transport robot 3 into the two cassettes C1 and C2 on the push-up portion 23 so that the substrates W1 and W2 are arranged at the normal pitch NP. At this time, the substrates W1 and the substrates W2 are separated in such a manner that the substrates W1 to be received in the cassette C1 are left in the shallow grooves 351A in the area AR1 whereas the substrates W2 to be received in the cassette C2 pass through the deep grooves 351B in the area AR1. That is, the area AR1 of the retaining columns 35R and 35L is used as a substrate transfer area for holding the substrates W1 at the normal pitch NP which are to be transferred to the pushup portion 23, and the outer peripheries of the substrates W1 are fitted in the shallow grooves 351A in the substrate transfer area AR1 for retention of the substrates W1.

As discussed hereinabove, the substrate processing apparatus of the fourth embodiment employs the push-up portion 32 and the retaining columns 35R and 35L of the substrate transport robot 3 to render the arrangement of the substrates W changeable between the normal pitch and the half pitch within the substrate processing apparatus. This eliminates the need to provide the pitch changing apparatus outside the substrate processing apparatus and to couple the pitch changing apparatus to the substrate processing apparatus, as in the first and second embodiments. Therefore, the deposition of particles on the substrates and the damages to the substrates are reduced. Furthermore, the problem of the increased size of the apparatus due to the coupling of the pitch changing apparatus to the substrate processing apparatus is eliminated.

Additionally, in the substrate processing apparatus of the fourth embodiment, the side surface of the retaining columns 35R and 35L of the substrate transport robot 3 is divided into the five areas used for the respectively exclusive purposes: the substrate receiving area AR2 used for changing the pitch of the unprocessed substrates, the unprocessed substrate retaining area AR4 for holding the substrates which have not yet been processed, the in-processing substrate retaining area AR3 for holding the substrates W with the cleaning liquid deposited thereon, the processed substrate retaining area AR5 for holding the substrates W which have been subjected to the cleaning processing and the drying processing, and the substrate transfer area AR1 used for changing the pitch of the processed substrates.

Thus, for example, if the substrates transported into the apparatus are contaminated with particles and the like, the contamination is caught by and stays in the substrate receiving area AR2 or the unprocessed substrate retaining area AR4. Droplets of the cleaning liquid deposited on the substrates which are being cleaned are caught by and stay in the in-processing substrate retaining area AR3. In other words, the processed substrate retaining area AR5 and the substrate transfer area AR1 never hold the substrates W which have not yet been processed or the substrates W which are being cleaned. This prevents the transfer of the contamination of the unprocessed substrates to the substrates W which have been subjected to the cleaning processing and the drying processing or the deposition of the cleaning liquid from the substrates which are being cleaned onto such processed substrates W. Consequently, yields in the substrate processing apparatus according to the present invention may be enhanced.

With reference to FIGS. 22 and 23, the retaining columns 35R and 35L have grooves 35X formed on opposite sides of the in-processing substrate retaining area AR3 and extending in the longitudinal direction of the retaining columns 35R and 35L (in the direction of the Y axis). The grooves 35X are provided to prevent the droplets of the cleaning liquid deposited on the in-processing substrate retaining area AR3 which holds the substrates being cleaned from flowing outwardly to other areas, to ensure the prevention of the deposition of the cleaning liquid onto the processed substrates.

<5. Fifth Embodiment>

The substrate processing apparatus according to a fifth embodiment of the present invention will be described below. The substrate processing apparatus of the fifth embodiment does not make the above described pitch change, but transports and processes the substrates W while maintaining the pitch of the substrates W received in the cassettes C placed on the cassette rest portion 21. More specifically, the substrate transport robot 3 of the fifth embodiment does not hold and transport the substrates W1 and W2 received in the two cassettes C1 and C2 as one substrate group as in the first to fourth embodiments, but holds and transports the substrates W received in one cassette C as they are. Other constructions and operation of the whole substrate processing apparatus are similar to those of the first embodiment, and the description thereof will be dispensed with herein.

Figure 29:
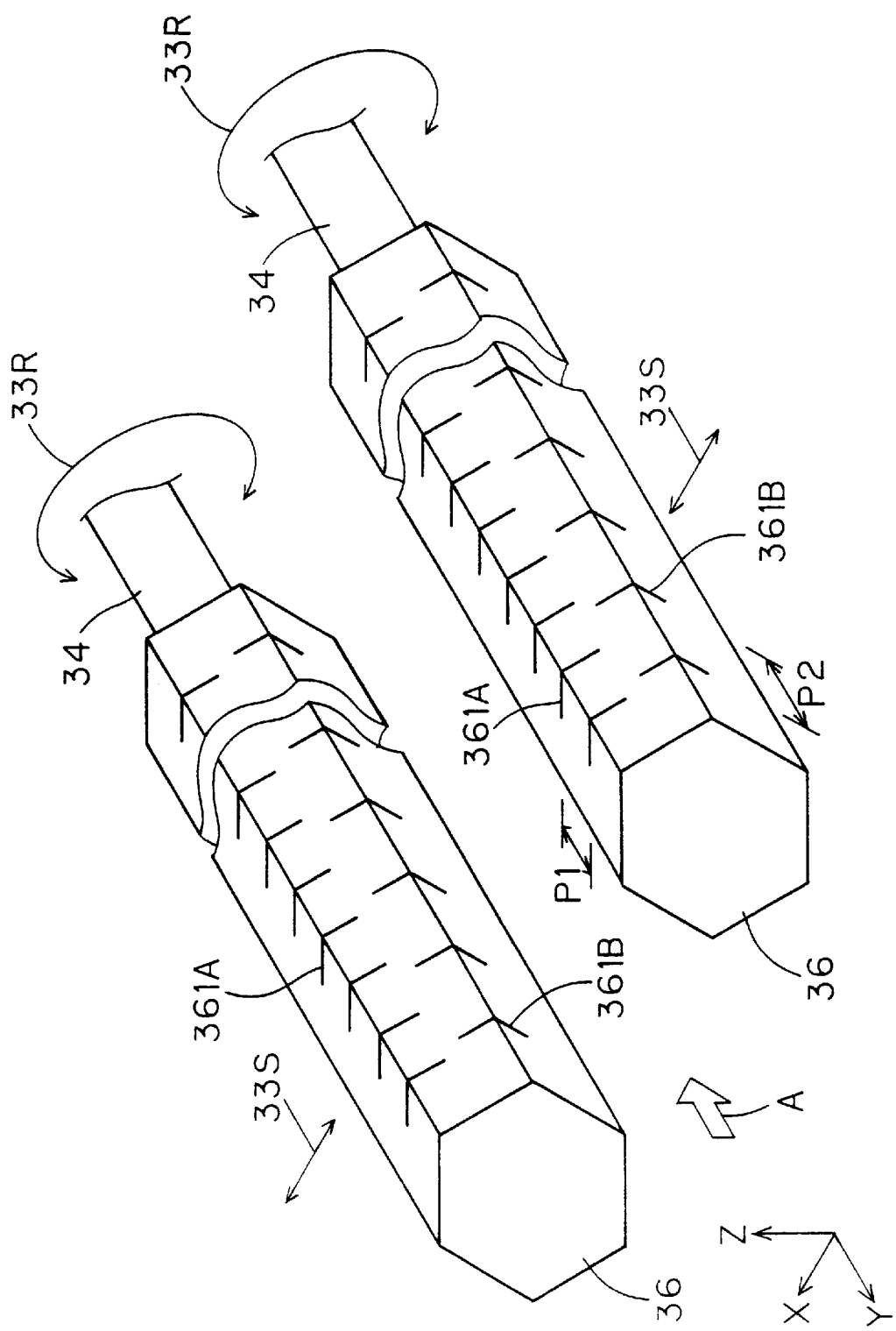
FIG. 29 is a perspective view of the retaining columns of the substrate processing apparatus according to a fifth embodiment of the present invention.

The construction and operation of the substrate transport robot 3 of the fifth embodiment will be discussed below. FIG. 29 is a perspective view of parts of the substrate transport robot 3 which hold the substrates W in the substrate processing apparatus of the fifth embodiment.

The substrate transport robot 3 includes two retaining columns 36 movable in the X direction of FIG. 1 and each having the shape of a hexagonal prism extending in the Y direction. These retaining columns 36 hold the outer peripheries of the substrates W to retain the substrates W in the upright attitude.

Each of the retaining columns 36 has the shape of a regular hexagonal prism elongated in the Y direction, as shown in FIG. 29. The two retaining columns 36 are connected through respective shafts 34 extending in the Y direction to the main body portion 3a (retention driving mechanism) of the substrate transport robot 3. The main body portion 3a allows the retaining columns 36 to open and close in the X direction as indicated by arrows 33S and to rotate on the respective shafts 34 as indicated by arrows 33R.

The retaining columns 36 have grooves formed therein for holding the substrates W in the upright attitude. The grooves of the retaining columns 36 of the fifth embodiment have two types of pitches. Specifically, the grooves include grooves 361A having a first pitch P1 which is a substrate arrangement spacing that allows the cassette C to accommodate 50 substrates, and grooves 361B having a second pitch P2 which is a substrate arrangement spacing that allows the cassette C to accommodate 40 substrates. The second pitch P2 at which a smaller number of substrates are accommodated is accordingly greater than the first pitch P1. The two retaining columns 36 are identical in shape with each other.

Figure 30:
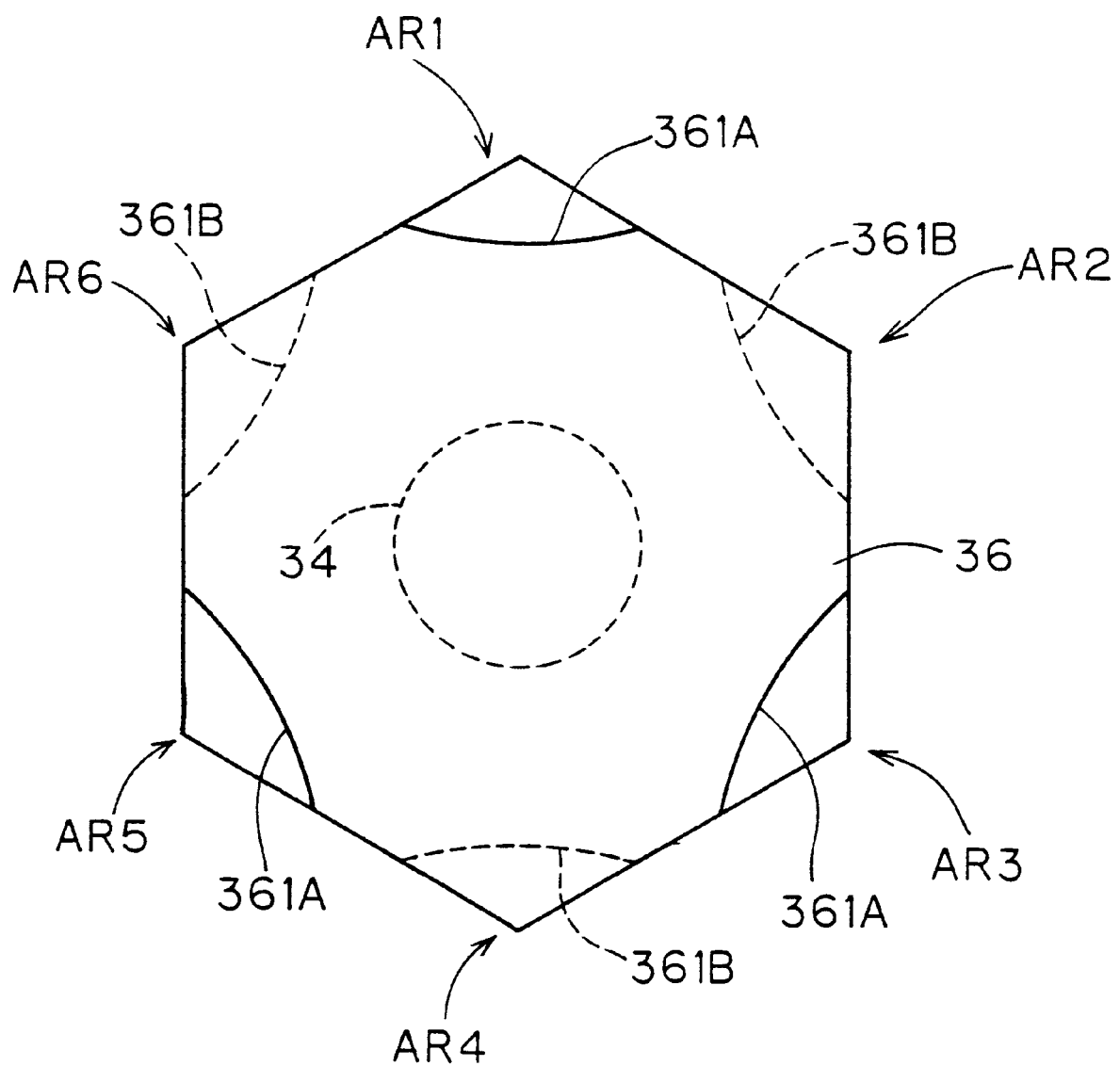
FIG. 30 shows the configuration of the retaining columns of FIG. 29.

FIG. 30 shows the configuration of each of the retaining columns 36 as viewed in the direction of the arrow A of FIG. 29. It should be noted that FIG. 30 shows a cross-section of each retaining column 36 taken along the plane XZ at the position of a groove 361A having the first pitch P1.

As illustrated in FIG. 30, the grooves 361A having the first pitch P1 and the grooves 361B having the second pitch P2 are equal in depth. That is, the grooves 361A and the grooves 361B are identical in individual configuration but are different in groove pitch.

The side surfaces of each retaining column 36 are divided into six areas AR1, AR2, AR3, AR4, AR5 and AR6 in a circumferential direction about an axis (axis extending in the Y direction) of each retaining column 36. Specifically, six ridge portions (corresponding to the vertex angle portions of the hexagon in FIG. 30) present on the side surfaces of each retaining column 36 serve as the respective areas. The grooves 361A are formed at the spacing of the first pitch P1 in the area AR1, the area AR3 and the area AR5 among the six areas. The grooves 361B are formed at the spacing of the second pitch P2 in the remaining areas, that is, in the area AR2, the area AR4 and the area AR6. In the fifth embodiment, these six areas are used for respectively determined purposes to be described later.

Figure 31:
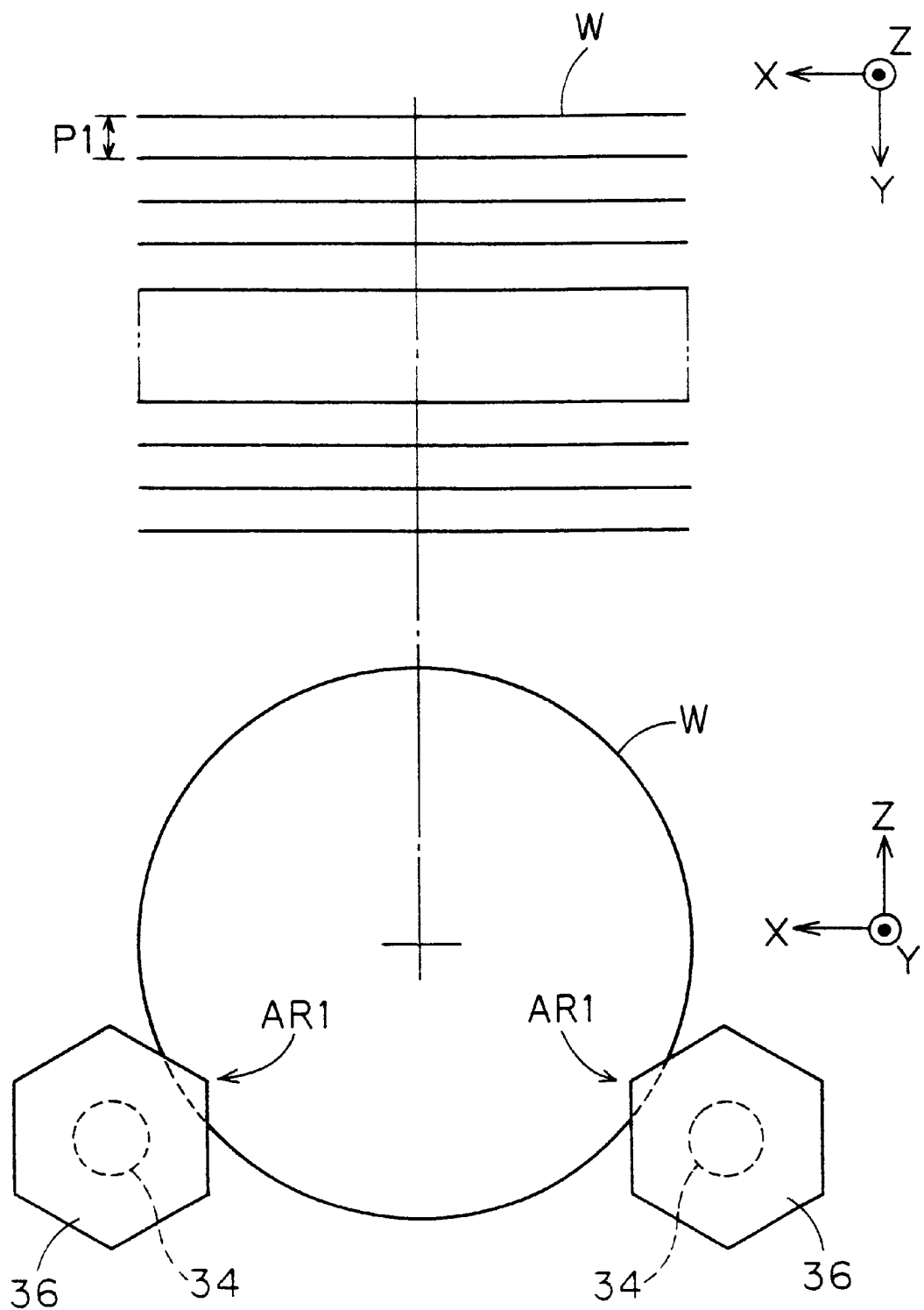
FIG. 31 shows the substrates held by the retaining columns of FIG. 29.
Figure 32:
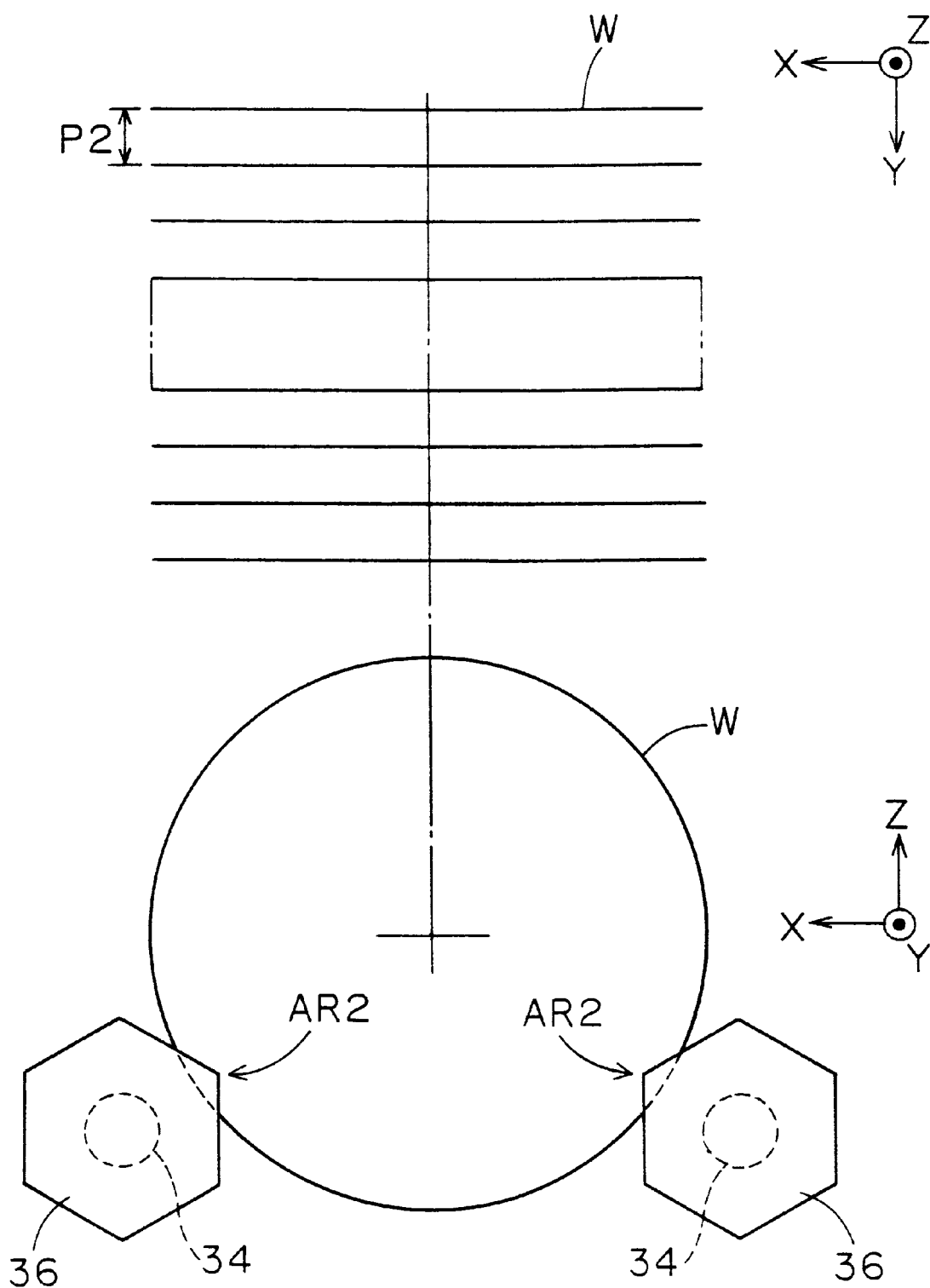
FIG. 32 shows the substrates held by the retaining columns of FIG. 29.

With reference to FIGS. 31 and 32, description will be given on the embodiment wherein the substrate transport robot 3 having the retaining columns 36 of the above described configuration holds the substrates W.

FIGS. 31 and 32 illustrate the substrates W held by the pair of retaining columns 36, with the centerline shown as associating the substrates W as viewed from the front and the substrates W as viewed from above with each other.

In the operation of the transfer of the substrates from the push-up portion 23 to the substrate transport robot 3 having the retaining columns 36, the push-up mechanism 23a with the cassette C placed thereon is initially positioned under the substrate transport robot 3. It is assumed that the cassette C receives 50 substrates at the spacing of the first pitch P1.

The upper surface of the push-up base 233 of the push-up mechanism 23a is formed with grooves into which the outer peripheries of the substrates W are fitted for retention of the substrates W in the upright attitude. As the push-up base 233 rises, the substrates W are pushed upwardly toward the substrate transport robot 3 while being maintained in the upright attitude (refer to FIG. 24). When the substrates W are pushed up to a predetermined level, the pair of retaining columns 36 move in the X direction so as to reduce the spacing therebetween and rotate. Thereafter, the push-up base 233 is lowered, and the substrates W are held, with the outer peripheries of the substrates W fitted in the grooves of the retaining columns 36, as shown in FIG. 31. In this stage, as shown in FIG. 31, the area AR1 of the retaining columns 36 is used as an unprocessed substrate retaining area for holding the substrates which have not yet been processed, and the substrates W are held at the spacing of the first pitch P1 in such a manner that the outer peripheries of the substrates W are fitted in the grooves 361A in the unprocessed substrate retaining area AR1.

When the transfer of the substrates W between the substrate transport robot 3 and the push-up portion 23 is completed, the substrates W are transported in the state shown in FIG. 31 to the pre-cleaning portion 4a. In the fifth embodiment, since all of the substrates W are held in the grooves 361A of the same configuration in the unprocessed substrate retaining area AR1, the substrates W are at the same level. As a result, also after the start of the transport by the substrate transport robot 3, adjacent substrates are prevented from contacting each other due to vibrations during the transport, and thus the substrates W are not damaged.

For the transfer of the substrates W between the substrate transport robot 3 and the pre-cleaning portion 4a, the substrate transport robot 3 is initially positioned over the pre-cleaning portion 4a and the like while retaining the substrates W. Thereafter, the elevating base 42a rises until it comes into contact with and holds all of the substrates W held by the retaining columns 36. Then, the substrate transport robot 3 moves the pair of retaining columns 36 in the X direction so as to widen the spacing therebetween. While holding the substrates W, the elevating base 42a is lowered into the bath 41 to dip the substrates W in the cleaning liquid.

When the cleaning processing in the pre-cleaning portion 4a is completed, the substrate transport robot 3 receives the substrates W from the pre-cleaning portion 4a. At this time, the elevating base 42a holding the cleaned substrates W is initially fully elevated, with the spacing between the pair of retaining columns 36 widened. Then, the pair of retaining columns 36 move in the X direction so as to reduce the spacing therebetween, and rotate. Thereafter, the elevating base 42a is lowered, whereby the outer peripheries of the substrates W come into sideways contact with the retaining columns 36 and the substrates W are held again at the spacing of the first pitch P1. In this stage, the area AR3 of the retaining columns 36 is used as an in-processing substrate retaining area for holding the substrates W which are being cleaned, that is, the substrates W with the cleaning liquid deposited thereon. The substrates W are held at the spacing of the pitch P1 in such a manner that the outer peripheries of the substrates W are fitted in the grooves 361A in the in-processing substrate retaining area AR3.

Subsequently, the substrates W are transported to one of the post-cleaning portions 4b by the substrate transport robot 3. The procedure of the transfer of the substrates W between the substrate transport robot 3 and the post-cleaning portion 4b is similar to the above described procedure of the transfer of the substrates W between the substrate transport robot 3 and the pre-cleaning portion 4a. Since the cleaning liquid is also deposited on the substrates W received from the post-cleaning portion 4b, the substrates W are held by the in-processing substrate retaining area AR3 of the retaining columns 36.

Upon completion of the cleaning processing, the substrates W are transported to the drying portion 4c by the substrate transport robot 3. The procedure of the transfer of the substrates W between the substrate transport robot 3 and the drying portion 4c is also similar to that described above. However, the substrates W received by the substrate transport robot 3 from the drying portion 4c are held by the area AR5 of the retaining columns 36. The area AR5 is used as a processed substrate retaining area for holding the substrates W which have been subjected to the cleaning processing and drying processing. The substrates W are held at the spacing of the first pitch P1 in such a manner that the outer peripheries of the substrates W are fitted in the grooves 361A of the processed substrate retaining area AR5.

Thereafter, the substrates W, upon completion of the processing, are transported to the position over the push-up portion 23 by the substrate transport robot 3. The substrate transport robot 3 performs the operations in reverse relation with the operations thereof performed when the substrate transport robot 3 receives the substrates W from the push-up portion 23, to insert the substrates W into the cassette C so that the substrates W are arranged at the first pitch P1.

On the other hand, the retaining columns 36 of the fifth embodiment have the grooves 361B having the spacing of the second pitch P2 in the areas AR2, AR4 and AR6. Therefore, substrates arranged at the spacing of the second pitch P2 may be transported.

In this case, the push-up mechanism 23b with the cassette C for the second pitch P2 placed thereon is initially located under the substrate transport robot 3. The upper surface of the push-up base 233 of the push-up mechanism 23b is also formed with grooves into which the outer peripheries of the substrates W are fitted for retention of the substrates W in the upright attitude. As the push-up base 233 rises, the substrates W are pushed up toward the substrate transport robot 3 while being maintained in the upright attitude. When the substrates W are pushed up to a predetermined level, the pair of retaining columns 36 move in the X direction so as to reduce the spacing therebetween and rotate. Thereafter, the push-up base 233 is lowered, and the substrates W are held, with the outer peripheries of the substrates W fitted in the grooves of the retaining columns 36, as shown in FIG. 32. In this stage, as shown in FIG. 32, the area AR2 of the retaining columns 36 is used as the unprocessed substrate retaining area for holding the substrates which have not yet been processed, and the substrates W are held at the spacing of the second pitch P2 in such a manner that the outer peripheries of the substrates W are fitted in the grooves 361B in the unprocessed substrate retaining area AR2.

The subsequent operation of the substrate transport robot 3 is similar to the above described operation of the substrate transport robot 3 transporting the substrates arranged at the first pitch P1. However, when the substrates arranged at the second pitch P2 are transported, the area AR4 is used as the in-processing substrate retaining area for holding the substrates W which are being cleaned and the area AR6 is used as the processed substrate retaining area for holding the substrates W which have been subjected to the cleaning processing and the drying processing.

As described hereinabove, the six areas present on the side surfaces of the retaining columns 36 of the fifth embodiment are properly used in accordance with the states of arrangement (the first pitch P1 or the second pitch P2) of the substrates to be transported and the states of processing (before processing, during processing or after processing). This is summarized as follows:

① The area AR1: the unprocessed substrate retaining area for the first pitch P1
② The area AR2: the unprocessed substrate retaining area for the second pitch P2
③ The area AR3: the in-processing substrate retaining area for the first pitch P1
④ The area AR4: the in-processing substrate retaining area for the second pitch P2
⑤ The area AR5: the processed substrate retaining area for the first pitch P1
⑥ The area AR6: the processed substrate retaining area for the second pitch PI Therefore, only the rotation and movement of the retaining columns 36 allow changes from the transport of the substrates arranged at the spacing of the first pitch P1 to the transport of the substrates arranged at the spacing of the second pitch P2, and vice versa. In other words, the substrates arranged at different pitches may be transported without using the apparatus specifically designed for pitch change, and the cassettes for different pitches may be used.

Furthermore, for example, if the substrates transported into the apparatus are contaminated with particles and the like, the contamination is caught by and stays in the unprocessed substrate retaining areas AR1 and AR2. Droplets of the cleaning liquid deposited on the substrates which are being cleaned are caught by and stay in the in-processing substrate retaining areas AR3 and AR4. In other words, the processed substrate retaining areas AR5 and AR6 never hold the substrates W which have not yet been processed or the substrates W which are being cleaned. This prevents the transfer of the contamination of the unprocessed substrates to the substrates W which have been subjected to the cleaning processing and the drying processing or the deposition of the cleaning liquid from the substrates which are being cleaned onto such processed substrates W. Consequently, the cleanliness of the substrates after the cleaning in the substrate processing apparatus according to the present invention may be readily maintained.

<6. Modifications>

Although the embodiments according to the present invention have been discussed hereinabove, the present invention is not limited to the above described embodiments.

For example, although the substrate processing apparatus 1 shown in FIG. 1 includes the single cassette rest unit 2U, two cassette rest units 2U may be provided, one for use in loading substrates into the apparatus only and the other for use in unloading substrates out of the apparatus only.

Although the two push-up mechanisms 23a and 23b have the respective pushup bases 233 in the first embodiment, the single push-up base 233 may be commonly used. Specifically, the single push-up base 233 is provided under the movable base 231 only for vertical movement, with the rotary bases 232 interchanged over the push-up base 233. This simplifies the mechanism of the push-up portion 23.

Further, in the first to fourth embodiments, the normal pitch NP at which the substrates W1 and W2 are received in the two cassettes C1 and C2 is changed to the half pitch HP for handling of the substrates. Instead, the pitch of the substrates W received in three cassettes C may be changed to a pitch that is one-third the normal pitch NP for handling of the substrates or to a smaller pitch. Such pitch changes are achieved by forming grooves of the types which conform to the number of times of receipt of the substrates W from the cassettes C, in the retaining bars, the retaining plates and the retaining columns.

Additionally, while the cassettes C are shown in FIG. 1 as placed on the cassette rest portion 21 so that the normal to the substrates W is oriented in the X direction, the normal to the substrates W may be oriented in the Y direction to eliminate the need for the rotary bases 232.

Further, the mechanism of the substrate transport robot 3 for holding the substrates W in the first to fourth embodiments is not limited to the mechanism of the above described embodiments if the mechanism, while holding a group of substrates W which are predetermined in number and arranged at the normal pitch NP, is capable of holding one or more additional groups of substrates. For instance, the retaining bars, the retaining plates, and the retaining columns may have protrusions for holding the substrates W and for the purpose of reducing the contact area therewith, in place of the grooves which are easy to form. Various modifications may be made to other structures.

Furthermore, although the side surfaces of each of the retaining columns 35R and 35L of the substrate transport robot 3 are divided into the five areas in the fourth embodiment, the number of areas after the division is not limited to five but may be determined arbitrarily depending on the steps of processing the substrate. It is, though, preferable to ensure at least three areas for adapting to the substrates which have not yet been processed, the substrates being processed, and the substrates which have already been processed.

The configuration of the retaining columns 35R and 35L is not limited to the configuration illustrated in the fourth embodiment, but may be a columnar configuration, for example, other polygonal prisms or a circular cylinder.

Moreover, the shallow grooves 351A and the deep grooves 351B, which are formed in the substrate transfer area AR1 and the substrate receiving area AR2 among the five areas of the retaining columns 35R and 35L in the fourth embodiment, may be formed in other areas. More areas having the shallow grooves 351A and the deep grooves 351B allow a greater number of times of the pitch change, and the pitch of the substrates W may be changed to a pitch that is one-third or one-fourth the normal pitch NP for handling of the substrates W.

Further, although the side surfaces of each of the retaining columns 36 of the substrate transport robot 3 are divided into the six areas in the fifth embodiment, the number of areas after the division is not limited to six but may be determined arbitrarily depending on the steps of processing the substrate.

The configuration of the retaining columns 36 is not limited to the regular hexagonal prism, but may be a columnar configuration, for example, other polygonal prisms or a circular cylinder. It is required only to determine the use of each of a plurality of areas into which the columnar configuration is divided in the circumferential direction about the axis thereof.

Furthermore, the first pitch P1 is the substrate arrangement spacing which allows the cassette C to accommodate 50 substrates whereas the second pitch P2 is the substrate arrangement spacing which allows the cassette C to accommodate 40 substrates in the fifth embodiment. The pitches of present invention, however, are not limited to the above described pitches, but any combination of the first pitch P1 and the second pitch P2 is permitted. It is, though, preferable that the first pitch P1 and the second pitch P2 are the substrate arrangement spacings which are supposed to be frequently used.

Further, although the areas are formed in the ridge portions of the retaining columns 36 and the grooves are formed in the areas in the fifth embodiment, the surfaces may be used to define the areas in which the grooves are formed. However, the grooves formed in the ridge portions are easy to process.

Additionally, the number and types of processing units to be assembled in the substrate processing apparatus according to the present invention may be arbitrarily determined. For example, more pre-cleaning portions 4a and more post-cleaning portions 4b may be provided in the first to fifth embodiments, and a new cleaning portion of another type may be provided. In such cases, the number of areas defined in the retaining columns 35R, 35L and 36 is preferably determined in accordance with the types of processing.

What is claimed is:

1. A substrate processing apparatus for performing predetermined processing on a group of substrates arranged in parallel at a first pitch, said substrate processing apparatus comprising:

a) cassette moving means (231) for sequentially moving a plurality of cassettes (C) to a plurality of transfer positions which are shifted by said first pitch from each other, each of said cassettes being capable of receiving a predetermined number of substrates (W) arranged at a second pitch which is an integral multiple of said first pitch;

b) transfer means (23) for holding said predetermined number of substrates in each of said plurality of transfer positions to take out said predetermined number of substrates from said plurality of cassettes;

c) transport means (3) for receiving sequentially a plurality of times said predetermined number of substrates in association with said plurality of transfer positions from said transfer means to hold substrates having been received in said plurality of cassettes as said group of substrates to transport said group of substrates while holding said group of substrates; and d) processing means (4U) for performing said predetermined processing upon said group of substrates transported by said transport means.

2. The substrate processing apparatus of claim 1, wherein each of said cassettes is capable of receiving said predetermined number of substrates maintained in an upright attitude, wherein said transfer means includes means (233) for vertically moving said predetermined number of substrates, and wherein said transport means holds each of said group of substrates in an upright attitude.

3. The substrate processing apparatus of claim 2, wherein said transport means includes:

two retaining plates (33) having retaining surfaces for holding an outer periphery of each of said group of substrates sideways, and a retention driving mechanism (3a) for causing said two retaining plates to perform a holding operation, and wherein said retaining surfaces of said two retaining plates have a plurality of uneven configurations associated respectively with a plurality of operations of transferring said predetermined number of substrates between said transfer means and said transport means, and the outer peripheries of said group of substrates come in contact with said plurality of uneven configurations respectively, whereby said group of substrates are held in the upright attitude.

4. The substrate processing apparatus of claim 3, wherein said plurality of uneven configurations are a plurality of grooves formed in said retaining surfaces.

5. The substrate processing apparatus of claim 4, wherein said plurality of grooves include first grooves (331A) having a predetermined depth, and second grooves (331B) having a depth greater than the depth of said first grooves, and wherein said second grooves are arranged at said second pitch.

6. The substrate processing apparatus of claim 5, wherein said retention driving mechanism rotates each of said two retaining plates about a shaft (34) extending in the direction of the arrangement of said group of substrates to cause said holding operation.

7. The substrate processing apparatus of claim 6, wherein said group of substrates held by said transport means are positioned substantially at the same level.

8. The substrate processing apparatus of claim 7, wherein said second pitch is twice greater than said first pitch.

9. The substrate processing apparatus of claim 5, wherein said retention driving mechanism rotates one of said two retaining plates about a shaft (34) extending in the direction of the arrangement of said group of substrates to cause said holding operation.

10. A substrate processing apparatus for performing predetermined processing on a group of substrates arranged in parallel at a first pitch, said substrate processing apparatus comprising:

a) processing means (4U) for performing said predetermined processing upon said group of substrates;

b) transport means (3) for transporting said group of substrates which have been subjected to said predetermined processing by said processing means;

c) cassette moving means (231) for sequentially moving a plurality of cassettes (C) to a plurality of transfer positions which are shifted by said first pitch from each other, each of said cassettes being capable of receiving a predetermined number of substrates (W) arranged at a second pitch which is an integral multiple of said first pitch; and d) transfer means (23) for repeating a plurality of times the operation of receiving said predetermined number of substrates from among said group of substrates transported by said transport means to introduce said predetermined number of substrates into each of said plurality of cassettes sequentially moved to said plurality of transfer positions, thereby to insert said group of substrates into said plurality of cassettes.

11. A substrate processing apparatus for performing predetermined processing on a group of substrates arranged in parallel at a first pitch, said substrate processing apparatus comprising:

a) processing means (4U) for performing said predetermined processing upon said group of substrates;

b) cassette moving means (231) for sequentially moving a plurality of cassettes (C) to a plurality of transfer positions which are shifted by said first pitch from each other, each of said cassettes being capable of receiving a predetermined number of substrates (W) arranged in an upright attitude at a second pitch which is an integral multiple of said first pitch; and c) transfer means (23) for holding said predetermined number of substrates in each of said plurality of transfer positions and vertically moving said predetermined number of substrates to take out said predetermined number of substrates from said plurality of cassettes and to insert said predetermined number of substrates into said plurality of cassettes; and d) transport means (3) for holding said group of substrates in an upright attitude to transport said group of substrates between said transfer means and said processing means while holding said group of substrates, wherein said transport means receives sequentially a plurality of times said predetermined number of substrates in association with said plurality of transfer positions from said transfer means to hold substrates which have been received in said plurality of cassettes and which have not yet been subjected to said predetermined processing as said group of substrates, and wherein said transfer means repeats a plurality of times the operation of receiving said predetermined number of substrates from among said group of substrates subjected to said predetermined processing and held by said transport means to introduce said predetermined number of substrates into each of said plurality of cassettes sequentially moved to said plurality of transfer positions, thereby to insert said group of substrates into said plurality of cassettes.

12. The substrate processing apparatus of claim 11, wherein said transport means includes:

d-1) two retaining columns (35R, 35L) each having a plurality of retaining areas for holding an outer periphery of each of said group of substrates sideways, and d-2) a retention driving mechanism (3a) for causing said two retaining columns to perform a holding operation, and wherein said plurality of retaining areas are defined by dividing a side surface of each of said retaining columns in a circumferential direction about an axis of each retaining column, wherein said plurality of retaining areas include a substrate receiving area (AR2) for holding said predetermined number of substrates received from said transfer means, and a substrate transfer area (AR1) for holding said predetermined number of substrates to be transferred to said transfer means, and wherein at least said substrate receiving area and said substrate transfer area among said plurality of retaining areas have a plurality of uneven configurations associated respectively with a plurality of operations of transferring said predetermined number of substrates between said transfer means and said transport means.

13. The substrate processing apparatus of claim 12, wherein said plurality of uneven configurations are a plurality of grooves formed in said substrate receiving area and said substrate transfer area.

14. The substrate processing apparatus of claim 13, wherein said plurality of grooves include first grooves (351A) having a predetermined depth, and second grooves (351B) having a depth greater than the depth of said first grooves, and wherein said second grooves are arranged at said second pitch.

15. The substrate processing apparatus of claim 14, wherein said plurality of retaining areas further include an in-processing substrate retaining area (AR3) for holding substrates which are being subjected to said predetermined processing, wherein said in-processing substrate retaining area has a plurality of third grooves (351C) arranged at said first pitch, and wherein said group of substrates come in contact with said plurality of third grooves respectively, whereby said group of substrates are held in the upright attitude.

16. The substrate processing apparatus of claim 15, wherein said second pitch is twice greater than said first pitch.

17. A substrate processing apparatus for transporting a plurality of substrates (W) between a cassette (C) capable of receiving said plurality of substrates and a plurality of processing means (41, 41c) for performing predetermined processing on substrates, said substrate processing apparatus comprising:

a) two retaining columns (35R, 35L) having a plurality of retaining areas for holding an outer periphery of each of said plurality of substrates sideways, and b) a retention driving mechanism (3a) for causing said two retaining columns to perform a holding operation, wherein said plurality of retaining areas are defined by dividing a side surface of each of said retaining columns in a circumferential direction about an axis of each retaining column, and wherein said plurality of retaining areas include:

a substrate receiving area (AR2) for use in changing a pitch of said plurality of substrates which have not yet been subjected to said predetermined processing, an area (AR4) for holding said plurality of substrates which have not yet been subjected to said predetermined processing, an area (AR3) for holding said plurality of substrates which are being subjected to said predetermined processing, an area (AR5) for holding said plurality of substrates which have already been subjected to said predetermined processing, and a substrate transfer area (AR1) for use in changing a pitch of said plurality of substrates which have already been subjected to said predetermined processing.

18. A substrate processing apparatus for transporting a plurality of substrates (W) between a cassette (C) capable of receiving said plurality of substrates and processing means for performing predetermined processing on substrates, said substrate processing apparatus comprising:

a) two retaining columns (35R, 35L) having a plurality of retaining areas for holding an outer periphery of each of said plurality of substrates sideways, and b) a retention driving mechanism (3a) for causing said two retaining columns to perform a holding operation, wherein said plurality of retaining areas are defined by dividing a side surface of each of said retaining columns in a circumferential direction about an axis of each retaining column, wherein said processing means includes:

liquid processing means (41) for performing liquid processing using a predetermined processing liquid upon said plurality of substrates, and drying means (41c) for drying said plurality of substrates, and wherein said plurality of retaining areas include:

a substrate receiving area (AR2) for use in changing a pitch of said plurality of substrates which have not yet been subjected to said predetermined processing, an area (AR4) for holding said plurality of substrates which have not yet been subjected to said liquid processing, an area (AR3) for holding said plurality of substrates which are being subjected to said liquid processing, and an area (AR5) for holding said plurality of substrates which have already been dried.

19. A substrate processing apparatus for transporting a plurality of substrates (W) between a cassette (C) capable of receiving said plurality of substrates and processing means (4U) for performing predetermined processing on substrates, said substrate processing apparatus comprising:

a) two retaining columns (36) having a plurality of retaining areas for holding an outer periphery of each of said plurality of substrates sideways, and b) a retention driving mechanism (3a) for causing said two retaining columns to perform a holding operation, wherein said plurality of retaining areas are defined by dividing a side surface of each of said retaining columns in a circumferential direction about an axis of each retaining column, and wherein said plurality of retaining areas include an area wherein grooves (361A) having a first pitch are formed, and an area wherein grooves (361B) having a second pitch different from said first pitch are formed.

20. The substrate processing apparatus of claim 19, wherein said plurality of retaining areas include:

an area (AR1) formed with said grooves having said first pitch for holding said plurality of substrates which have not yet been subjected to said predetermined processing;

an area (AR5) formed with said grooves having said first pitch for holding said plurality of substrates which have already been subjected to said predetermined processing;

an area (AR2) formed with said grooves having said second pitch for holding said plurality of substrates which have not yet been subjected to said predetermined processing; and an area (AR6) formed with said grooves having said second pitch for holding said plurality of substrates which have already been subjected to said predetermined processing.

21. The substrate processing apparatus of claim 20, wherein said plurality of retaining areas further include:

an area (AR3) formed with said grooves having said first pitch for holding said plurality of substrates which are being subjected to said predetermined processing; and an area (AR4) formed with said grooves having said second pitch for holding said plurality of substrates which are being subjected to said predetermined processing.

22. The substrate processing apparatus of claim 21, wherein each of said two retaining columns is a polygonal prism in configuration, and wherein said plurality of retaining areas are formed in ridge portions of said polygonal prism.

23. The substrate processing apparatus of claim 21, wherein each of said two retaining columns is a polygonal prism in configuration, and wherein said plurality of retaining areas are formed in surfaces of said polygonal prism.

* * * * *